US012651618B2

(12) United States Patent
Ikeda et al.

(10) Patent No.: US 12,651,618 B2
(45) Date of Patent: Jun. 9, 2026

(54) SEMICONDUCTOR INTEGRATED CIRCUIT, RECEIVING DEVICE, AND MEMORY SYSTEM

(71) Applicant: Kioxia Corporation, Tokyo (JP)

(72) Inventors: Shinichi Ikeda, Fujisawa Kanagawa (JP); Shinya Kawakami, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 299 days.

(21) Appl. No.: 18/336,302

(22) Filed: Jun. 16, 2023

(65) Prior Publication Data

US 2024/0096381 A1 Mar. 21, 2024

(30) Foreign Application Priority Data

Sep. 16, 2022 (JP) .................................. 2022-148466

(51) Int. Cl.
*G11C 7/10* (2006.01)
*G06F 13/16* (2006.01)
*H04L 25/03* (2006.01)

(52) U.S. Cl.
CPC ........ *G11C 7/1048* (2013.01); *G06F 13/1668* (2013.01); *H04L 25/03159* (2013.01); *G06F 2213/16* (2013.01)

(58) Field of Classification Search
CPC ............... G11C 7/1048; G06F 13/1668; G06F 2213/16; H04L 25/03159

USPC ...................................................... 365/189.18
See application file for complete search history.

(56) References Cited

U.S. PATENT DOCUMENTS

| | | | |
|---|---|---|---|
| 10,944,601 B2 | 3/2021 | Yamazaki | |
| 2007/0241821 A1* | 10/2007 | Dally | H03G 3/3052 |
| | | | 330/279 |
| 2010/0283525 A1 | 11/2010 | Yoshikawa | |
| 2018/0006655 A1* | 1/2018 | Kim | H03L 7/23 |
| 2020/0313638 A1* | 10/2020 | Hong | H03F 3/45183 |
| 2021/0408970 A1* | 12/2021 | Hong | H03F 3/45744 |
| 2024/0039492 A1* | 2/2024 | Morikoshi | H03F 3/45475 |
| 2024/0088922 A1* | 3/2024 | Jang | H03F 1/0277 |

FOREIGN PATENT DOCUMENTS

| | | |
|---|---|---|
| JP | 6447056 B2 | 1/2019 |
| JP | 2020-188295 A | 11/2020 |
| WO | WO-2009/107173 A1 | 9/2009 |

* cited by examiner

*Primary Examiner* — Sung Il Cho
(74) *Attorney, Agent, or Firm* — Foley & Lardner LLP

(57) ABSTRACT

According to one embodiment, a semiconductor integrated circuit includes an equalizer circuit and a toggle detection circuit. The equalizer circuit is configured to amplify an input signal that are externally input to output an amplified signal as a first signal. The toggle detection circuit is configured to detect toggling of the first signal and to dynamically switch a gain of the equalizer circuit based on whether or not toggling of the first signal is detected.

19 Claims, 14 Drawing Sheets

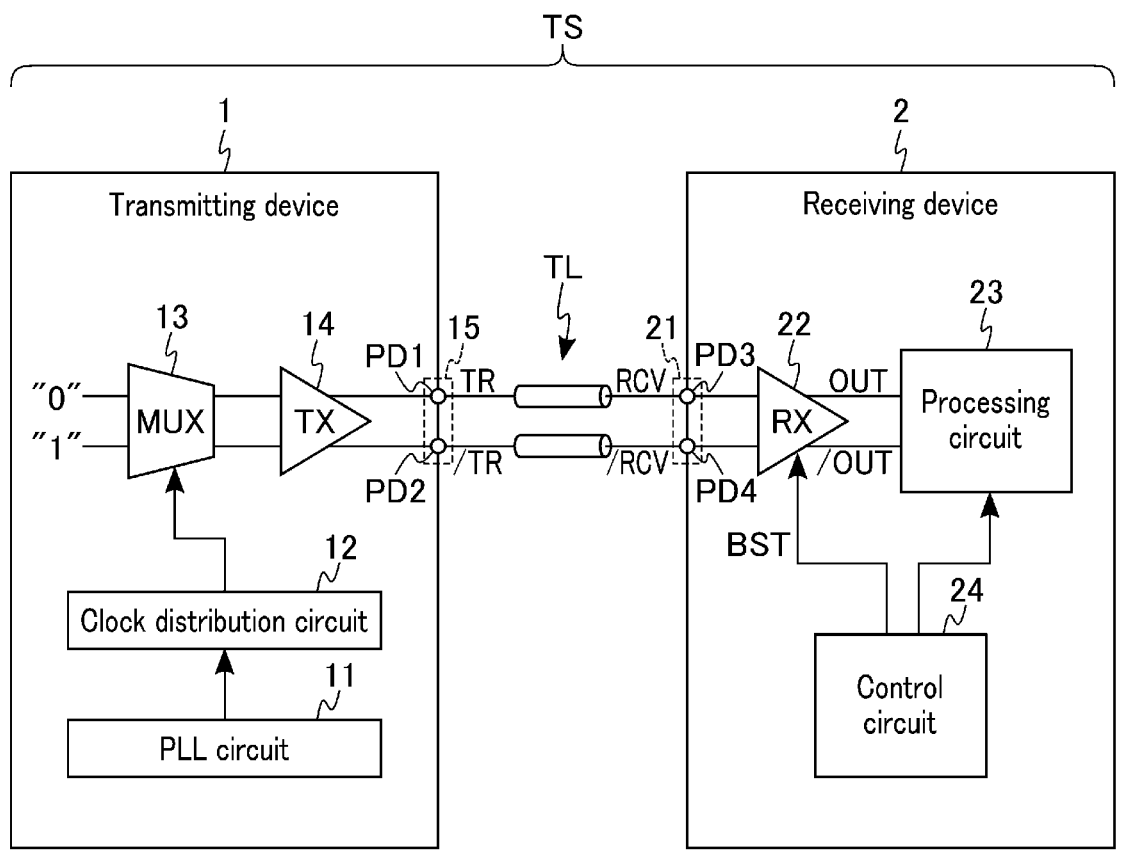
F I G. 1
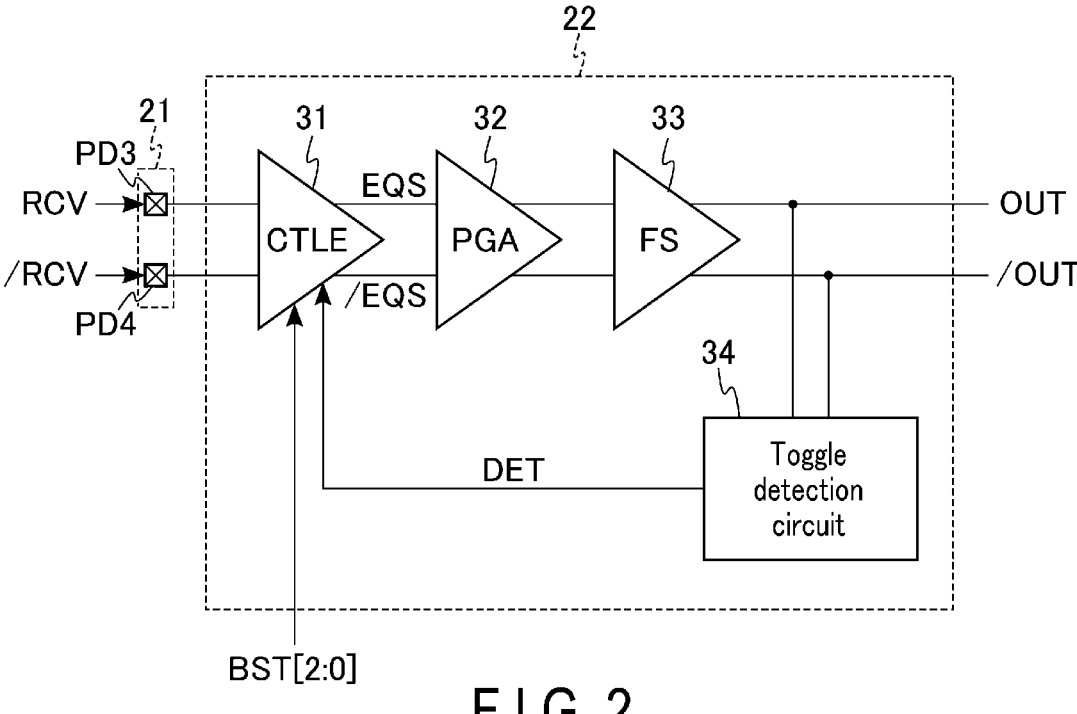
F I G. 2

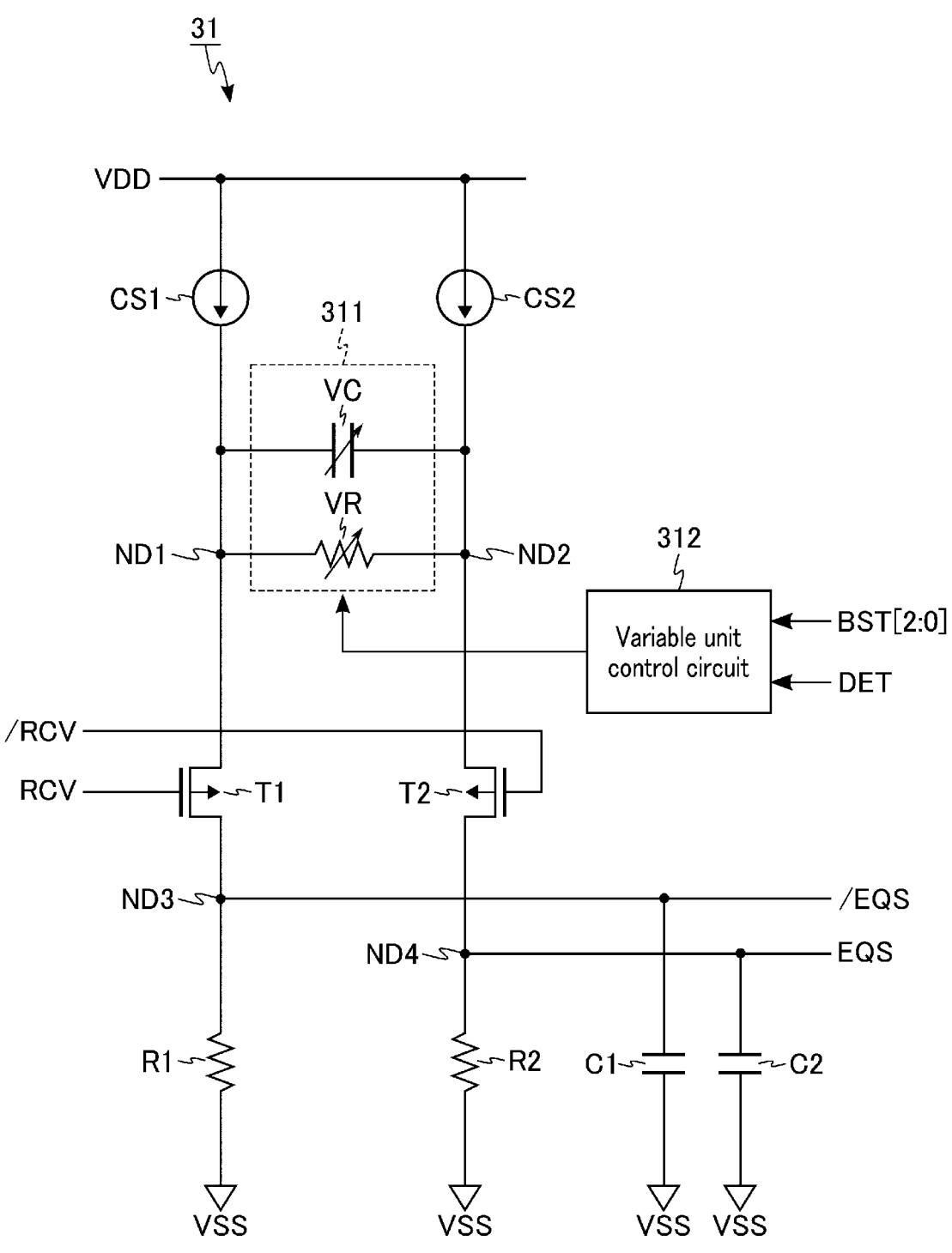
F I G. 3

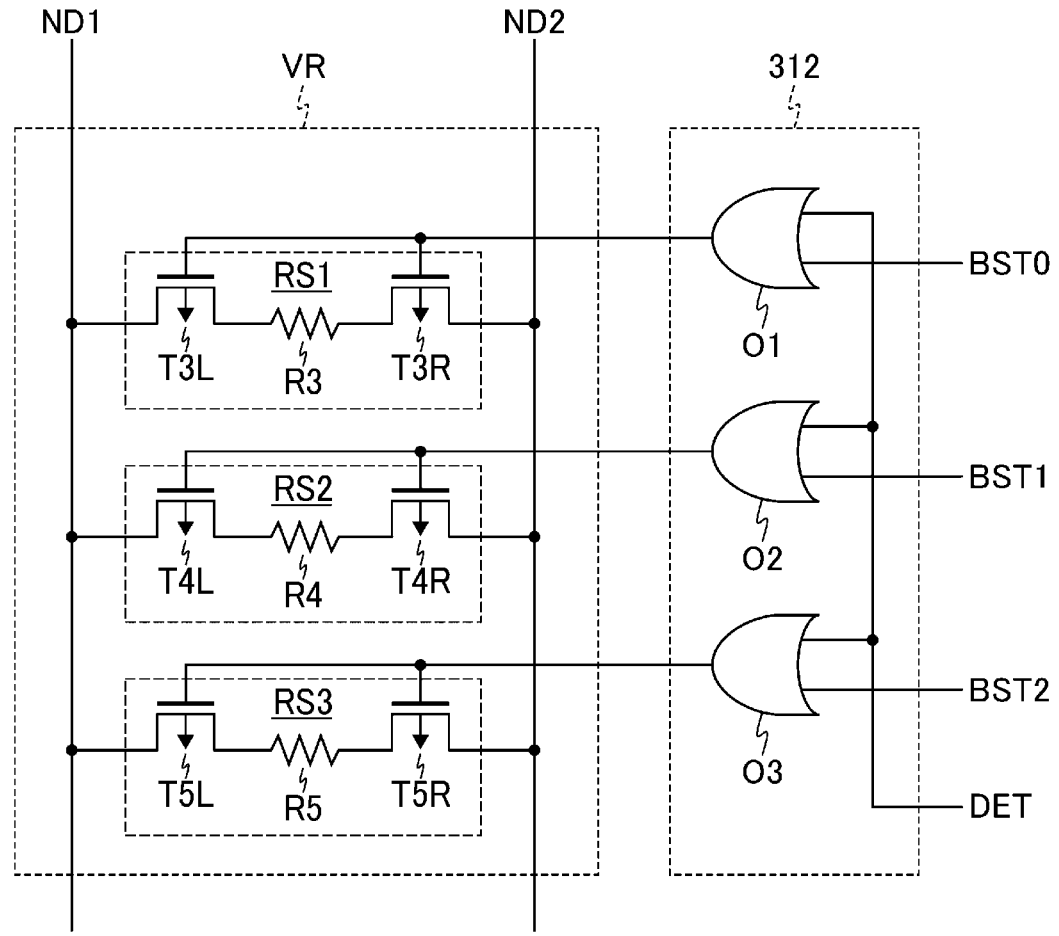
F I G. 4

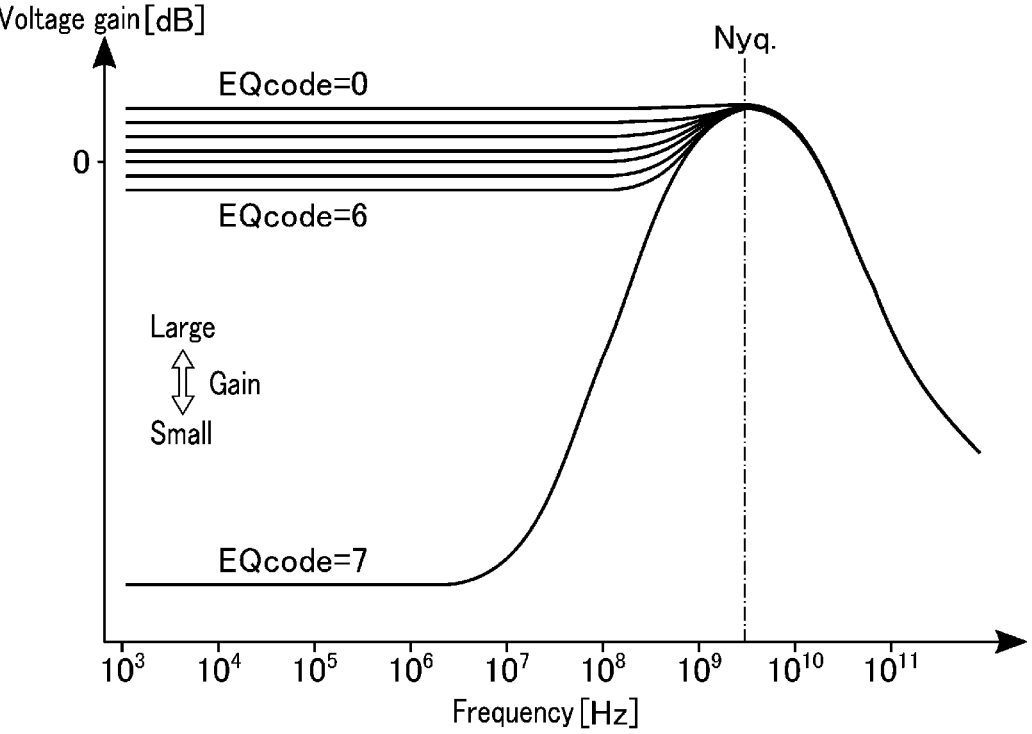
F I G. 5

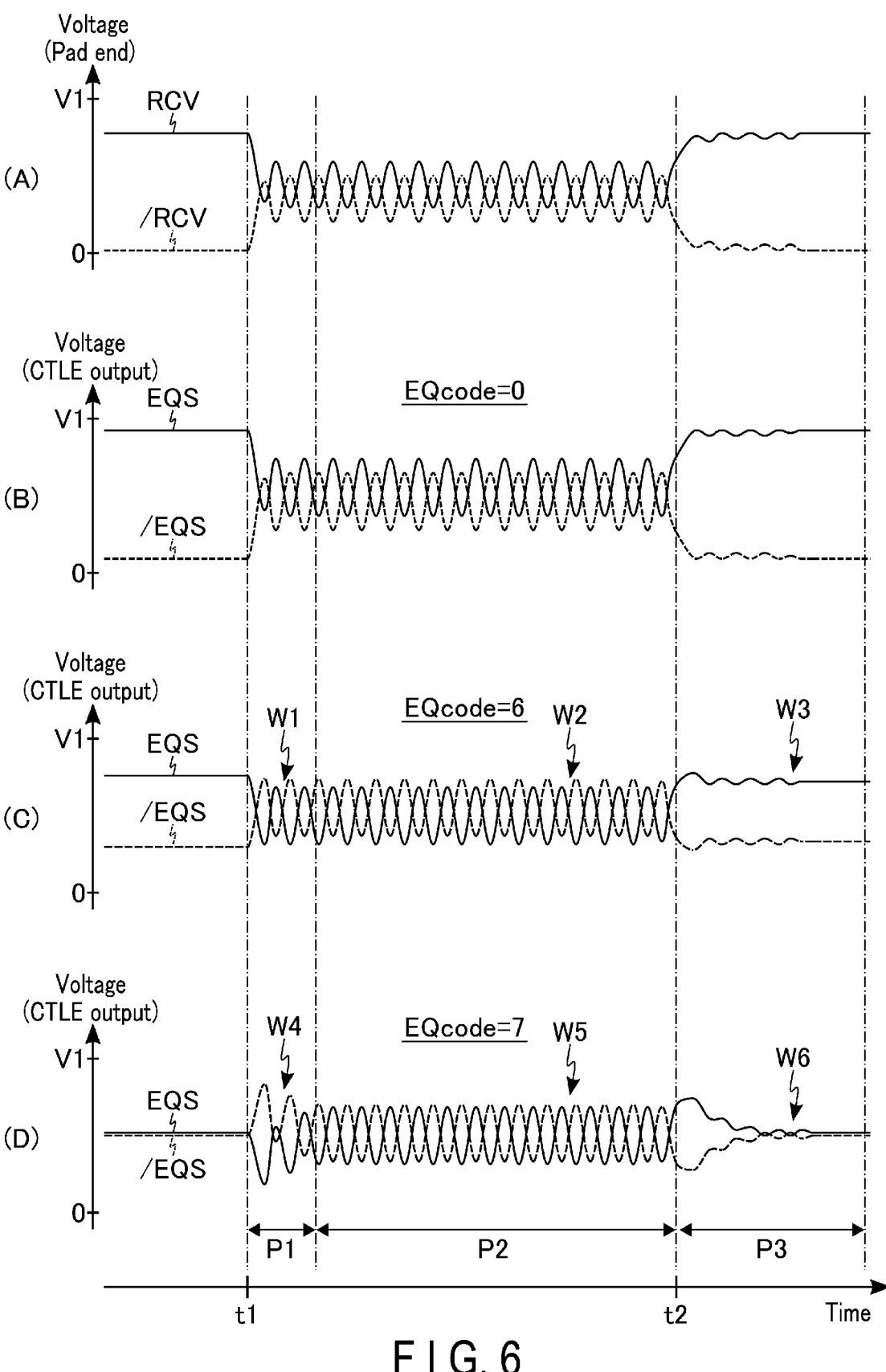
F I G. 6

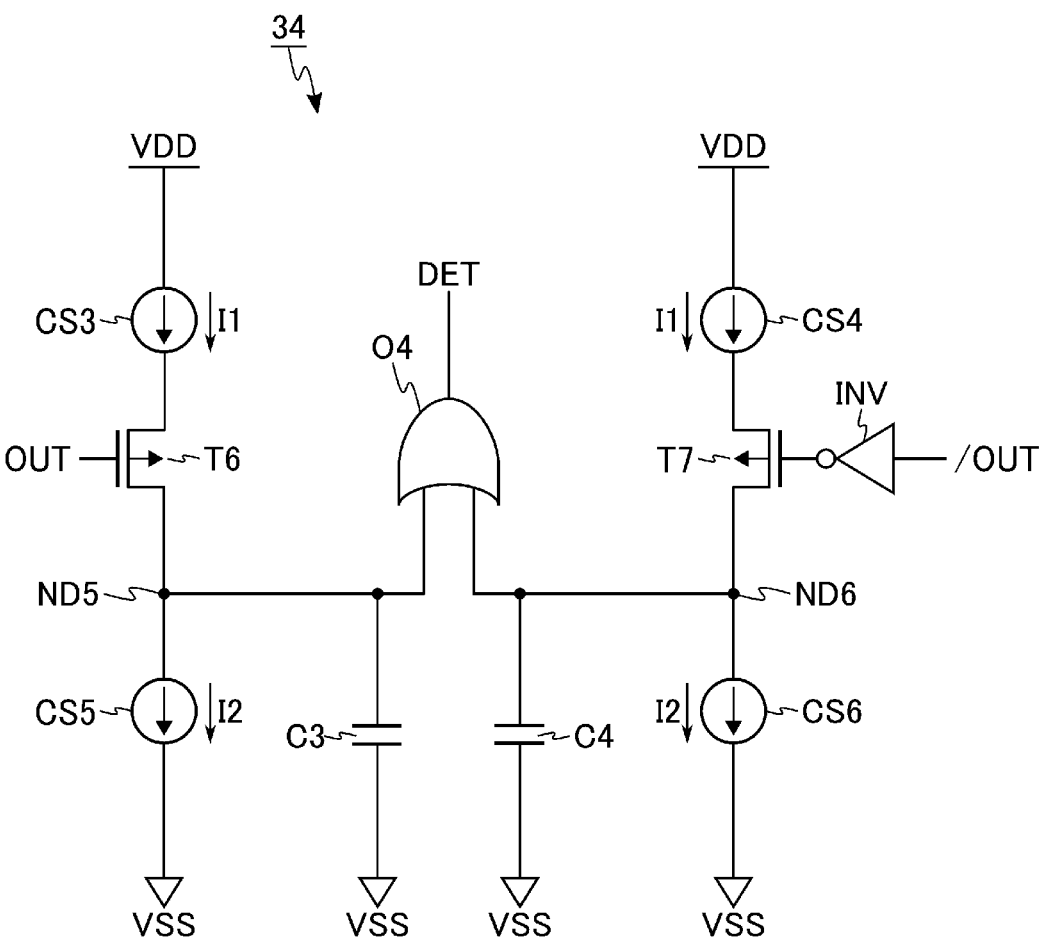
F I G. 7

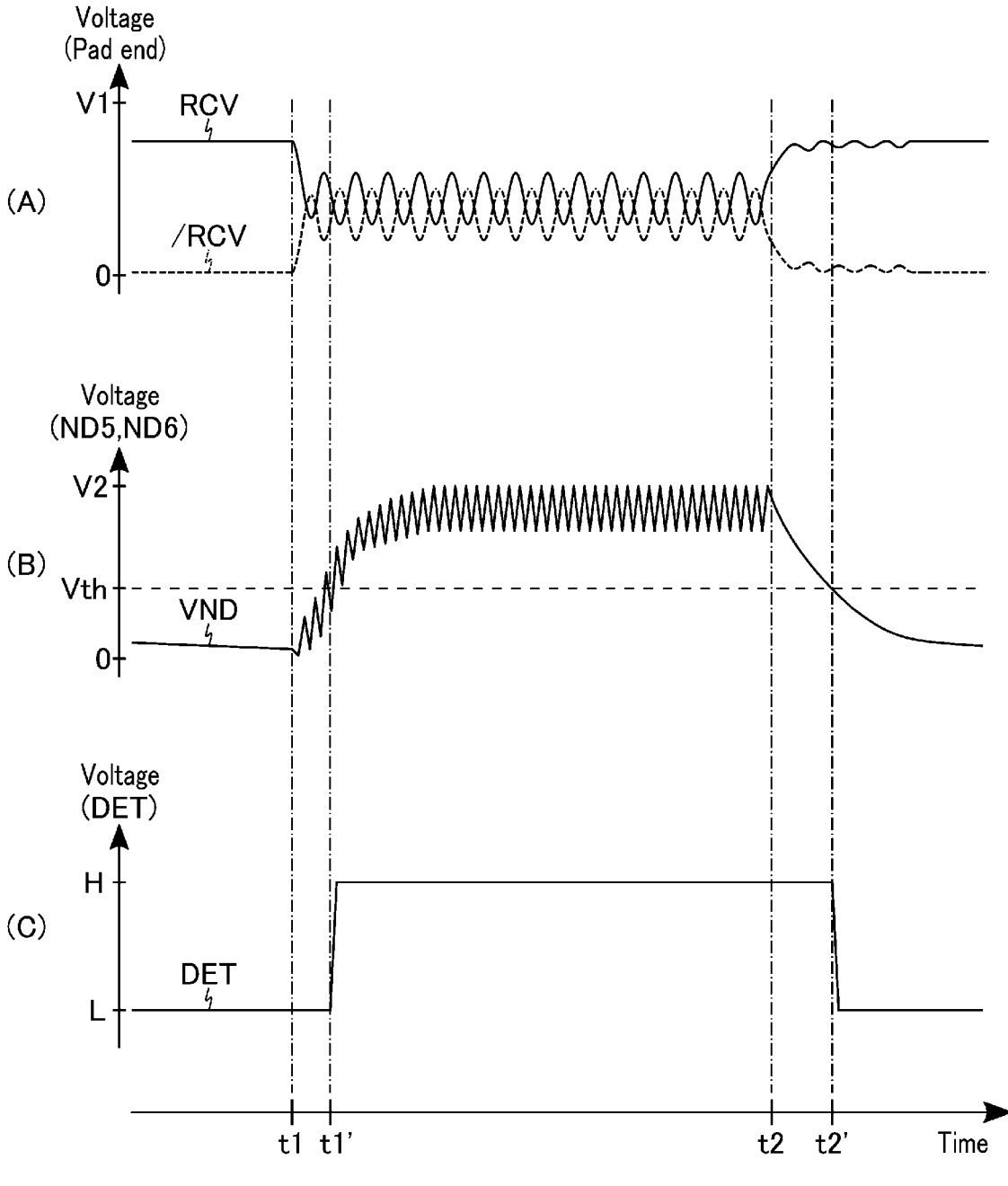
F I G. 8

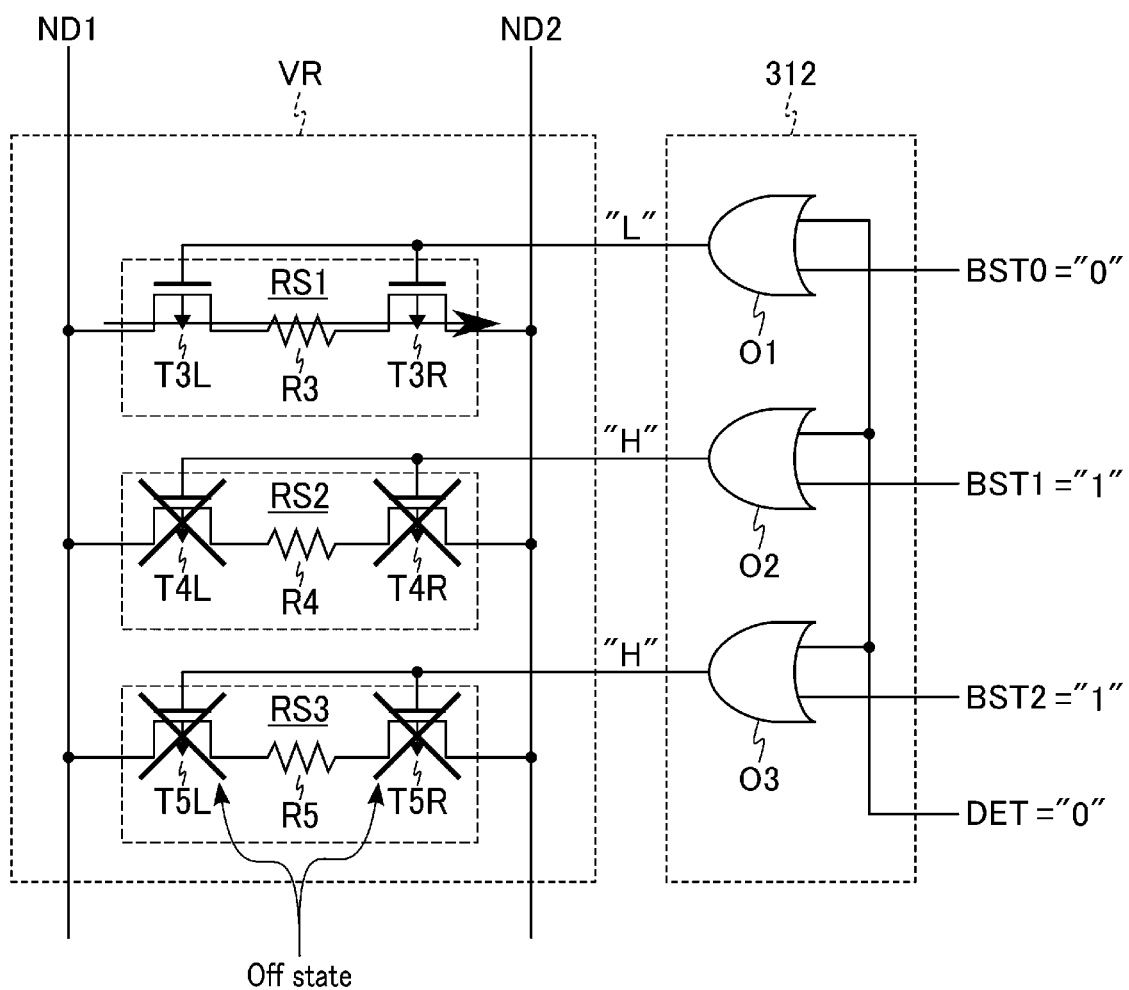
F I G. 9

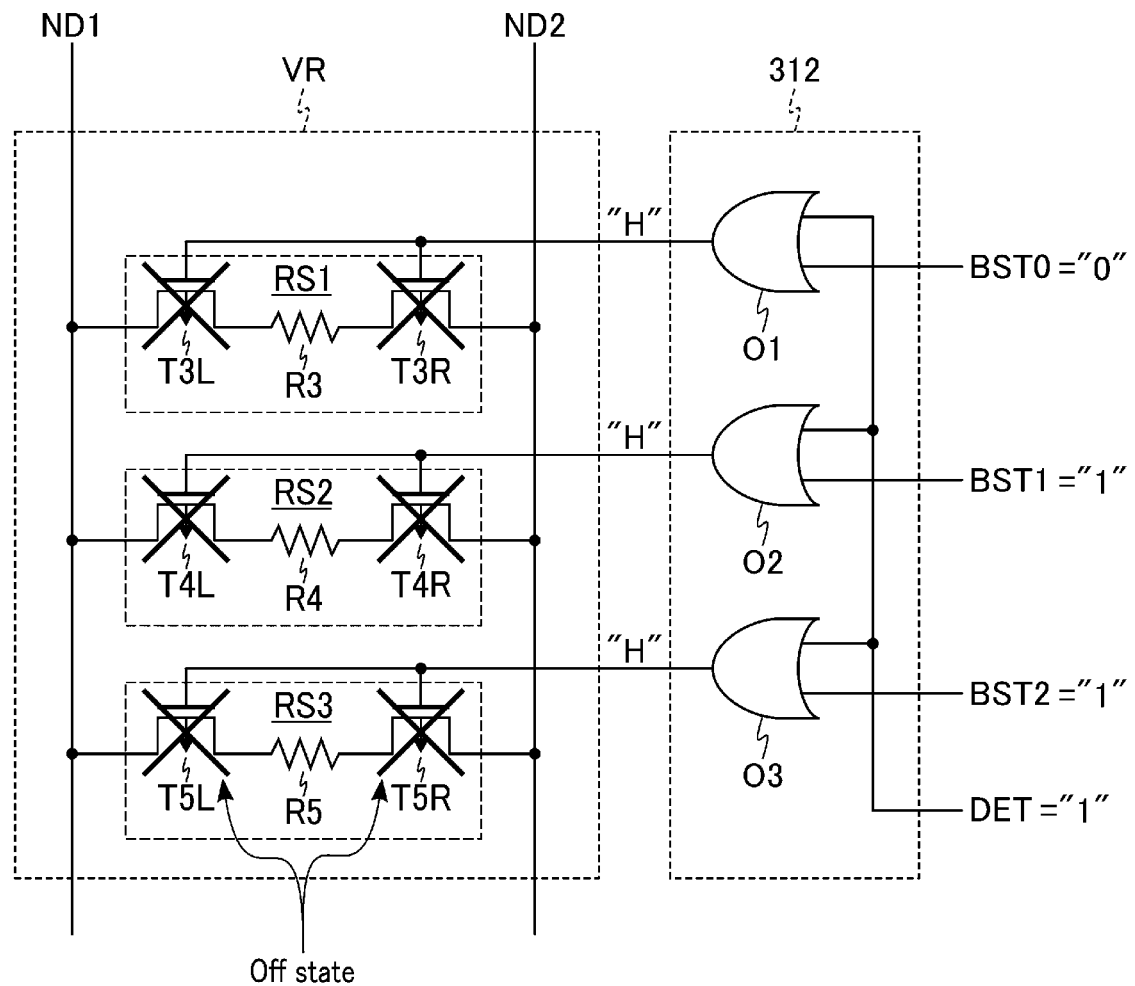
F I G. 10

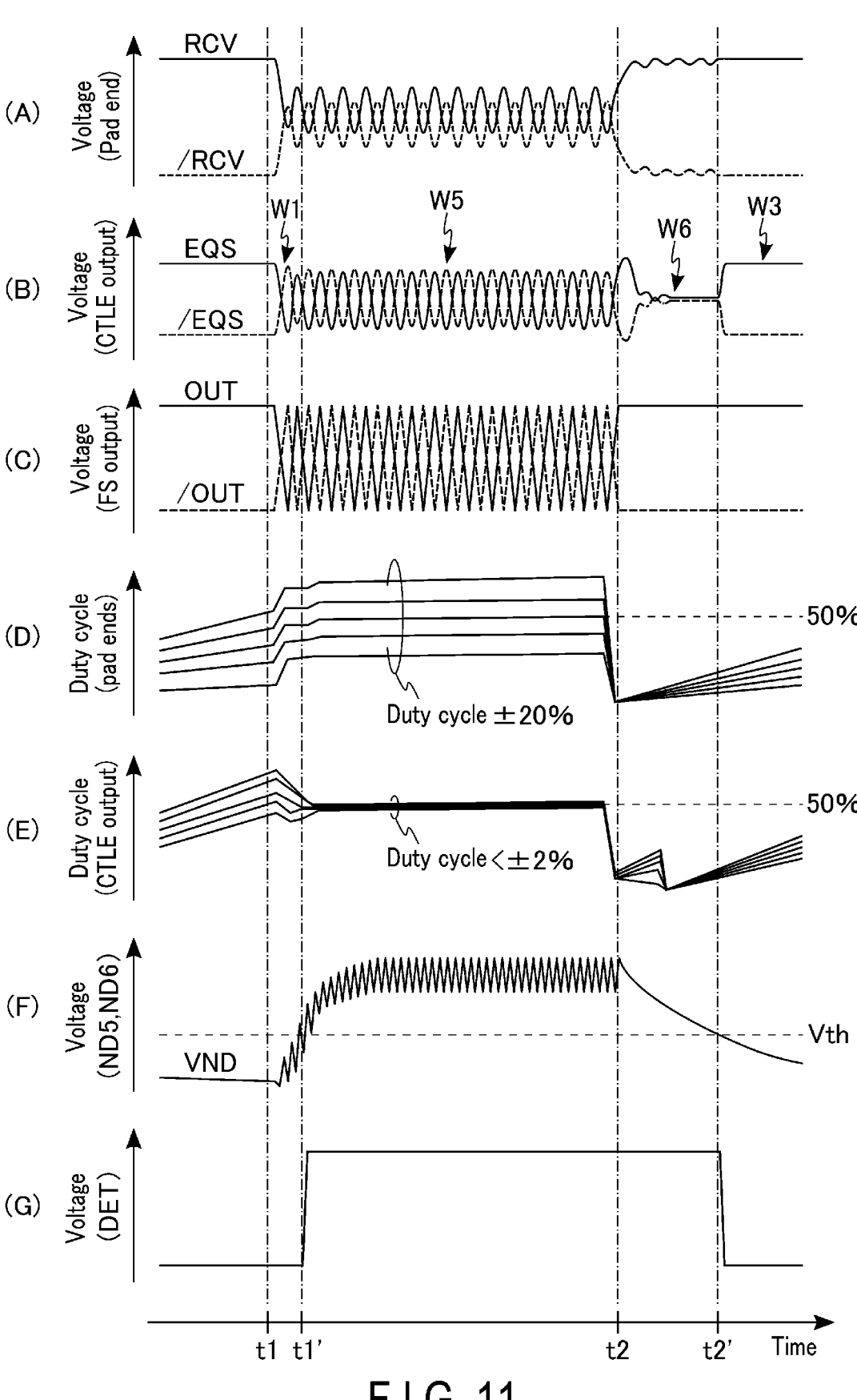
F I G. 11

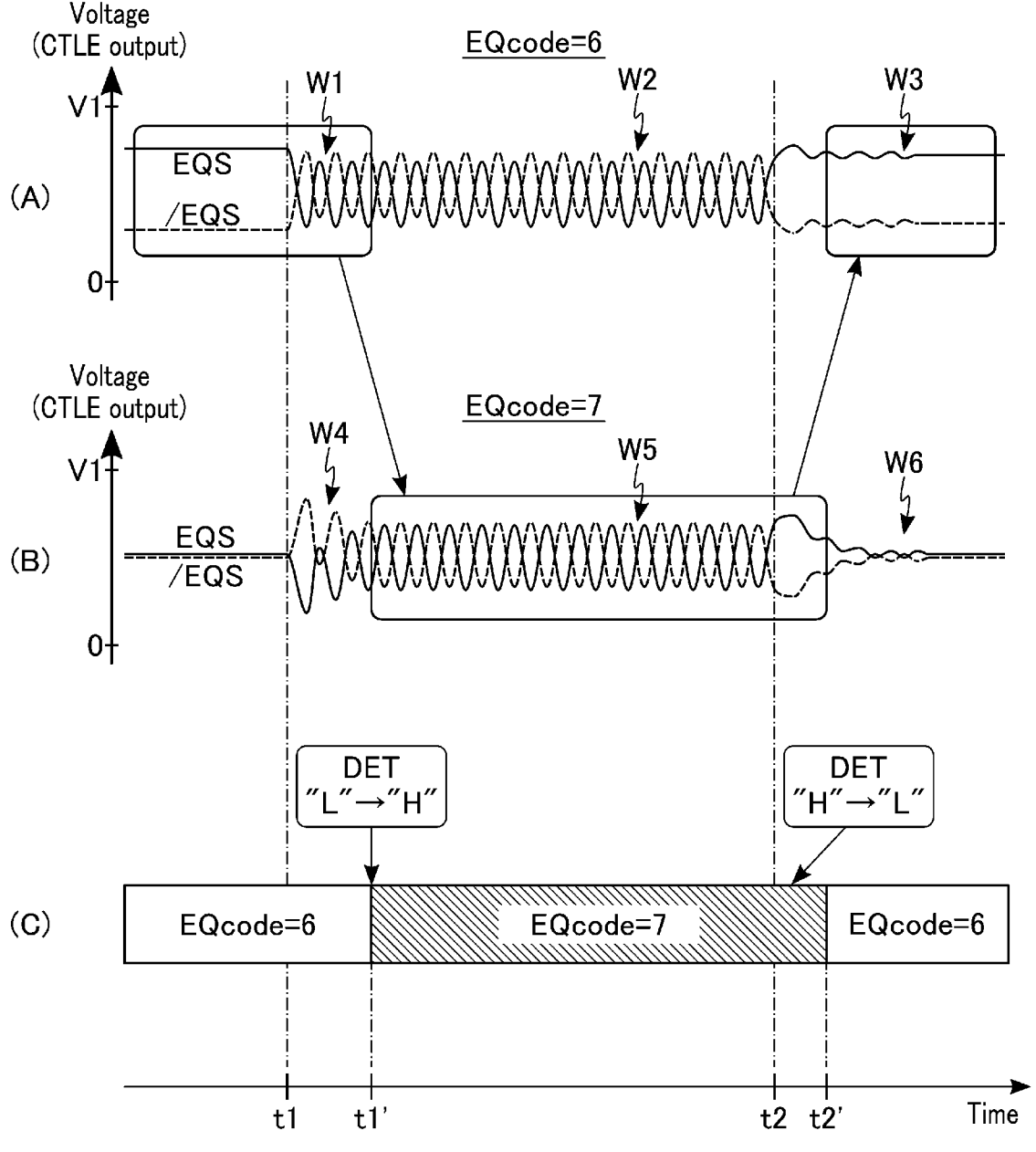
F I G. 12

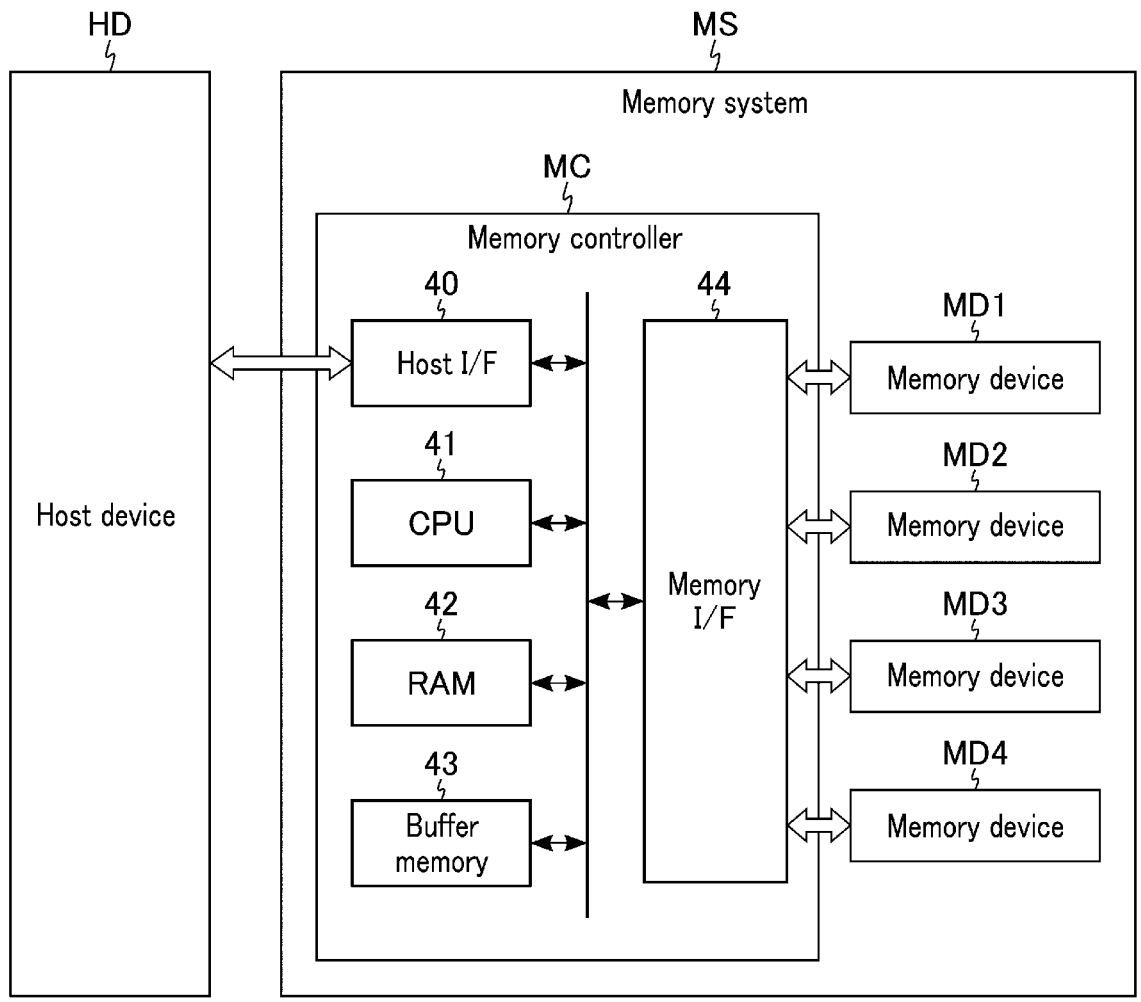
F I G. 13

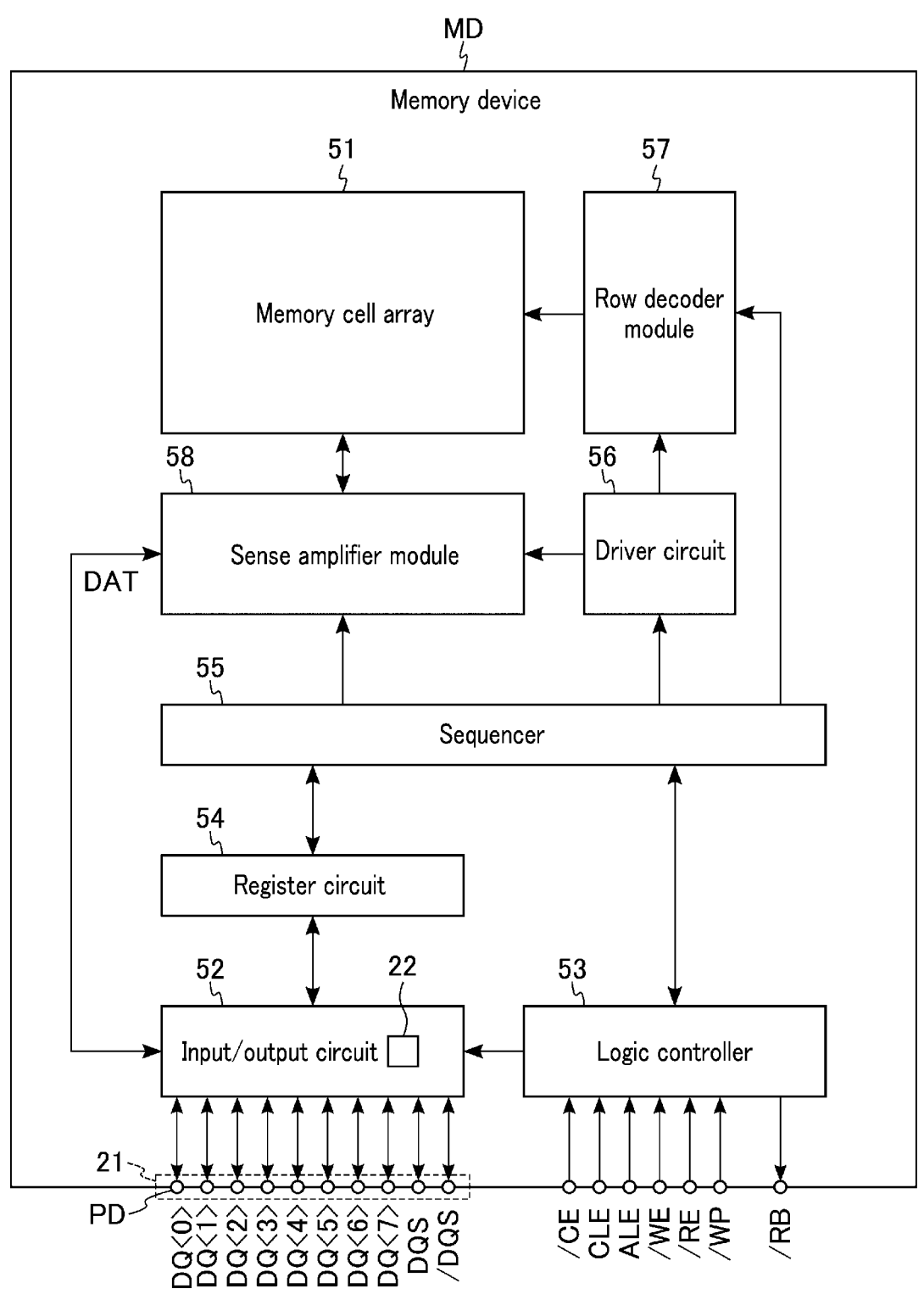
F I G. 14

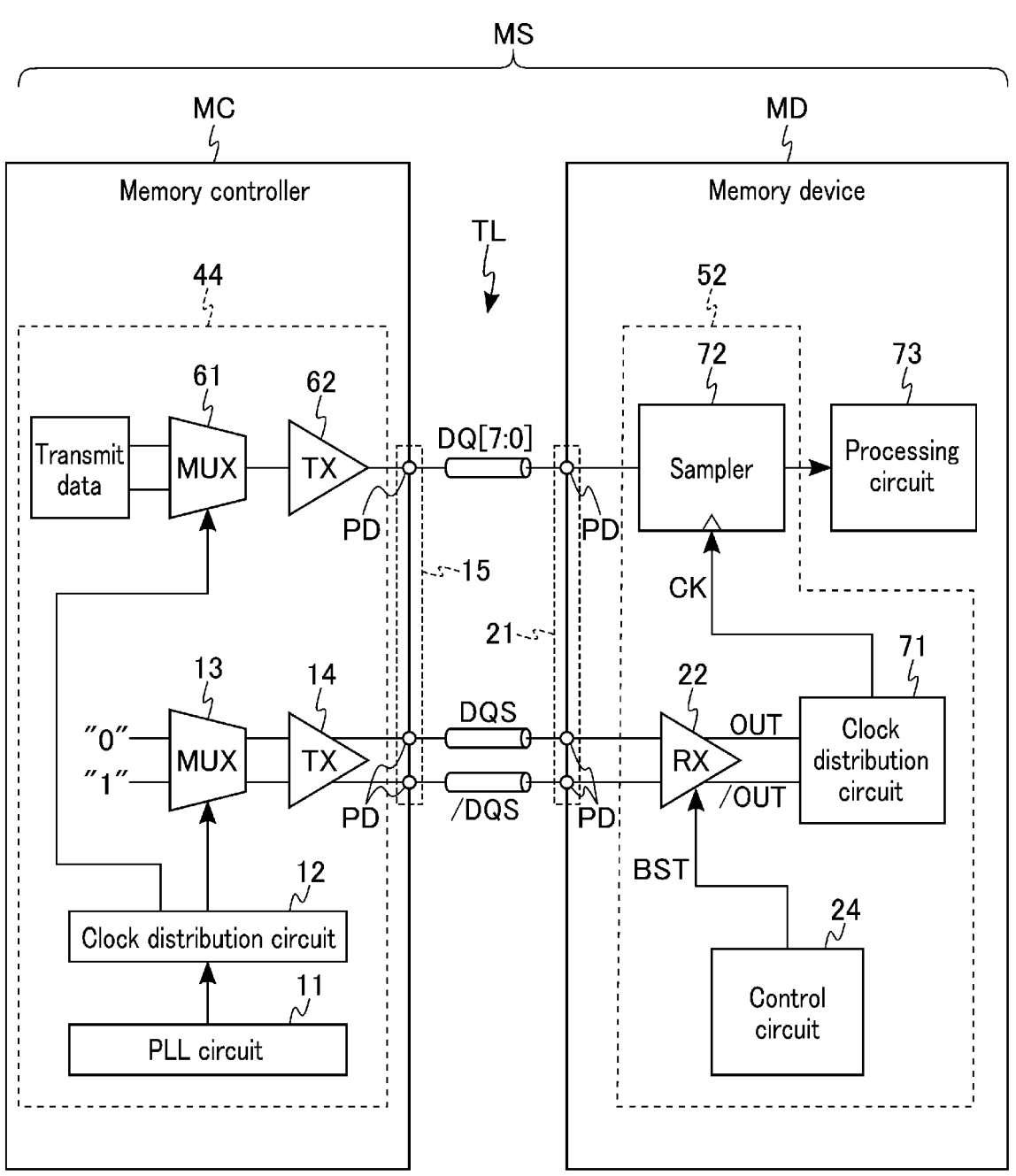
F I G. 15

SEMICONDUCTOR INTEGRATED CIRCUIT, RECEIVING DEVICE, AND MEMORY SYSTEM

CROSS-REFERENCE TO RELATED APPLICATION

This application is based upon and claims the benefit of priority from Japanese Patent Application No. 2022-148466, filed Sep. 16, 2022, the entire contents of which are incorporated herein by reference.

FIELD

Embodiments described herein relate generally to a semiconductor integrated circuit, a receiving device, and a memory system.

BACKGROUND

A receiving device is coupled to a transmitting device via a transmission line. The transmitting device transmits a signal to the receiving device via the transmission line. The receiving device receives a signal in which a loss occurs after the signal passes through the transmission line. The receiving device includes an equalizer circuit as a semiconductor integrated circuit configured to process received signals. The receiving device may correct a duty cycle of a signal transmitted from the transmitting device by adjusting a gain of the equalizer circuit.

BRIEF DESCRIPTION OF THE DRAWINGS

FIG. 1 is a block diagram showing an example of a configuration of a transmission system according to a first embodiment.

FIG. 2 is a circuit diagram showing an example of a circuit structure of a receiving circuit of a receiving device according to the first embodiment.

FIG. 3 is a circuit diagram showing an example of a configuration of a continuous time linear equalizer (CTLE) included in the receiving circuit according to the first embodiment.

FIG. 4 is a circuit diagram showing an example of a circuit configuration of a variable resistor and a variable unit control circuit of the CTLE according to the first embodiment.

FIG. 5 is a graph showing an example of frequency characteristics of the CTLE according to the first embodiment.

FIG. 6 is a timing chart showing an example of output characteristics of the CTLE according to the first embodiment.

FIG. 7 is a circuit diagram showing an example of a circuit configuration of a toggle detection circuit included in the receiving circuit according to the first embodiment.

FIG. 8 is a timing chart showing an example of output characteristics of the toggle detection circuit according to the first embodiment.

FIG. 9 is a schematic diagram showing a first example of an operation of the variable resistor and the variable unit control circuit of the CTLE according to the first embodiment.

FIG. 10 is a schematic diagram showing a second example of an operation of the variable resistor and the variable unit control circuit of the CTLE according to the first embodiment.

FIG. 11 is a timing chart showing a simulation result of an operation of the receiving circuit according to the first embodiment.

FIG. 12 is a schematic diagram showing an image of gain switching by the receiving circuit according to the first embodiment.

FIG. 13 is a block diagram showing a configuration example of a memory system according to a second embodiment.

FIG. 14 is a block diagram showing a configuration example of a memory device of the memory system according to the second embodiment.

FIG. 15 is a block diagram showing a configuration example of an interface between a memory controller and the memory device of the memory system according to the second embodiment.

DETAILED DESCRIPTION

In general, according to one embodiment, a semiconductor integrated circuit includes an equalizer circuit and a toggle detection circuit. The equalizer circuit is configured to amplify an input signal that are externally input to output an amplified signal as a first signal. The toggle detection circuit is configured to detect toggling of the first signal and to dynamically switch a gain of the equalizer circuit based on whether or not toggling of the first signal is detected.

Hereinafter, embodiments will be described with reference to the drawings. Each of the embodiments is an example of an apparatus and a method to embody a technical idea of the invention. The drawings are schematic or conceptual. Part of each configuration may be suitably omitted. In the following descriptions, the elements having substantially the same function and configuration are denoted by the same numeral or sign. The reference symbols may contain a character string or the like, which is to distinguish similar components having the same reference symbols, from each other.

<1> First Embodiment

A transmission system TS according to a first embodiment is described.

<1-1> Configuration

<1-1-1> Configuration of Transmission System TS

FIG. 1 is a block diagram showing an example of a configuration of a transmission system TS according to a first embodiment. As shown in FIG. 1, the transmission system TS includes a transmitting device 1, a receiving device 2, and a transmission line TL. The transmission system TS may transmit a digital signal from the transmitting device 1 to the receiving device 2. The transmitting device 1 is coupled to the receiving device 2 via a transmission line TL. The transmission line TL is a structural or a spatial transmission medium for transmitting a digital signal from the transmitting device 1 to the receiving device 2.

(Configuration of Transmitting Device 1)

The transmitting device 1 is a device for outputting transmit signals TR and /TR to the transmission line TL. The transmit signals TR and /TR are differential signals. The transmit signals TR and /TR are, for example, clock signals that are output in accordance with an operation of the transmitting device 1. Loss may be caused in the transmit signals TR and /TR after they pass through the transmission line TL in accordance with transmission characteristics (for example, frequency characteristics) of the transmission line TL. In the following, the transmit signals TR and /TR subjected to the loss caused by the transmission line TL are referred to as a "receive signal RCV" and a "receive signal /RCV", respectively. The transmit signal /TR corresponds to an inversion signal of the transmit signal TR. The receive signal /RCV corresponds to an inversion signal of the receive signal RCV.

The transmitting device 1 includes a phase locked loop (PLL) circuit 11, a clock distribution circuit 12, a multiplexer (MUX) 13, a transmitting circuit (TX) 14, and a terminal portion 15, for example.

The PLL circuit 11 is a phase synchronizing circuit. The PLL circuit 11 includes a clock signal oscillator. The PLL circuit 50 may generate different types of clock signals by changing a frequency division ratio through frequency multiplication. Multiple types of clock signals have a synchronized phase. Then, the PLL circuit 11 outputs the generated clock signals to the clock distribution circuit 12.

The clock distribution circuit 12 is a circuit configured to distribute multiple types of clock signals that are input from the PLL circuit 11 to a plurality of circuit elements included in the transmitting device 1. In the present embodiment, the clock distribution circuit 12 transfers one of the multiple types of clock signals that are input from the PLL circuit 11 to the multiplexer 13.

The multiplexer 13 is configured to be able to switch between a first state and a second state based on a clock signal that is input from the clock distribution circuit 12. The first state of the multiplexer 13 is a state where a first input terminal and a second input terminal thereof are coupled to a first output terminal and a second output terminal thereof respectively. The second state of the multiplexer 13 is a state where the first input terminal and the second input terminal thereof are coupled to the second output terminal and the first output terminal thereof respectively. The first input terminal and the second input terminal of the multiplexer 13 are supplied with voltages corresponding to "0" data and "1" data respectively. In other words, the multiplexer 13 is configured to be capable of outputting a compensation signal.

The transmitting circuit 14 is a transmitting circuit configured to match the impedance of a signal corresponding to the digital signal that is input from the multiplexer 13 to that of the transmission line TL and transmit the signal. Then, the transmitting circuit 14 transmits a signal to the receiving device 2 via the terminal portion 15 and the transmission line TL. A first input terminal and a second input terminal of the transmitting circuit 14 are coupled to the first output terminal and the second output terminal of the multiplexer 13, respectively. The signals that are output from a first output terminal and a second output terminal of the transmitting circuit 14 correspond to the transmit signals TR and /TR.

The terminal portion 15 includes a plurality of pads PD used for coupling the transmitting device 1 to the receiving device 2. The plurality of pads PD of the transmitting device 1 include a pad PD1 coupled to the first output terminal of the transmitting circuit 14 and a pad PD2 coupled to the second output terminal of the transmitting circuit 14.

(Configuration of Receiving Device 2)

The receiving device 2 is a device for receiving the receive signals RCV and /RCV from the transmission line TL. The receiving device 2 includes an equalizer circuit to which the receive signals RCV and /RCV are input. The receiving device 2 converts the receive signals RCV and /RCV into digital signals corresponding to the transmit signals TR and /TR. The receiving device 2 is configured to be capable of switching a gain of the equalizer circuit based on presence/absence of a transmission of a digital signal from the transmitting device 1.

The receiving device 2 includes a terminal portion 21, a receiving circuit (RX) 22, a processing circuit 23, and a control circuit 24, for example.

The terminal portion 21 includes a plurality of pads PD used for coupling the transmitting device 1 to the receiving device 2. The terminal portion 21 includes a pad PD3 configured to receive the receive signal RCV and a pad PD4 configured to receive the receive signal /RCV. In other words, the pad PD3 and the pad PD4 of the receiving device 2 is coupled to the pad PD1 and the pad PD2 of the transmitting device 1 respectively, through separate transmission lines TL.

The receiving circuit 22 is a circuit configured to receive signals that are input via the terminal portion 21, as digital signals. The receiving circuit 22 inputs a received digital signal to the processing circuit 23. The receive signals RCV and /RCV are received by a first input terminal and a second input terminal of the receiving circuit 22, respectively. The output signals OUT and /OUT are output from a first output terminal and a second output terminal of the receiving circuit 22, respectively. The receiving circuit 22 includes a continuous time linear equalizer (CTLE) as a gain-switchable equalizer circuit. The details of the CTLE are described later.

The processing circuit 23 is a processing unit configured to handle the digital signals received by the receiving circuit 22. The control circuit 23 includes, for example, a processor, such as a central processing unit (CPU), and a memory device, such as a read only memory (ROM), or a random access memory (RAM). The processing circuit 23 may include a NAND-type flash memory or a controller circuit configured to control the NAND-type flash memory. The processing circuit 23 may be coupled to the receiving device 2 externally.

The control circuit 24 is configured to control, for example, the receiving circuit 22 and the processing circuit 23. Specifically, the control circuit 24 supplies a control signal BST to the receiving circuit 22. The control signal BST is a control parameter used for changing a gain of the equalizer circuit included in the receiving circuit 22. The controller signal BST is, for example, a binary code and includes three-bit information (BST[2:0], namely a set of BST0, BST1, BST2). The value of the control signal BST may be fixed or discretionarily changed. The control signal BST may include one-bit information, two-bit information, or four- or larger bit information.

<1-1-2> Configuration of Receiving Circuit 22

FIG. 2 is a circuit diagram showing an example of a circuit structure of the receiving circuit 22 of the receiving device 2 according to the first embodiment. As shown in FIG. 2, the receiving circuit 22 includes, for example, a CTLE 31, a programmable gain amplifier (PGA) 32, a full scale (FS) amplifier 33, and a toggle detection circuit 34.

The CTLE 31 is an analog filter having a function as a linear equalizer. The CTLE 31 amplifies (boosts) a gain of a high frequency band of the receive signals RCV and /RCV in accordance with an EQ boost code (may be referred to as "EQcode" hereinafter) to generate equalized signal EQS and /EQS. The CTLE 31 outputs the generated equalized EQS and /EQS to the PGA 32. The EQ boost code corresponds to the control signal BST. Specifically, EQcode=0 corresponds to BST[2:0]=000, EQcode=1 corresponds to BST[2:0]=001, EQcode=6 corresponds to BST[2:0]=110, and EQcode=7 corresponds to BST[2:0]=111. The CTLE 31 may adjust a resistance value or the variable resistor included in the CTLE 31 and a capacitance value of the variable capacitance element, and the like, based on the EQ boost code.

The PGA 32 is an amplifier circuit capable of varying a DC gain. The PGA 32 adjusts a DC gain of the equalized signals EQS and /EQS that are input from the CTLE 31. The PGA 32 inputs the adjusted equalized signals EQS and /EQS to the FS 33. A variable gain amplifier (VGA) may be used instead of the PGA 32.

The FS 33 is a circuit configured to convert equalized signals EQS and /EQS adjusted via the PGA 32 into a CMOS level. Then, the FS 33 outputs the equalized signals EQS and /EQS converted into the CMOS level, as output signals OUT and /OUT, respectively. In other words, the output of the FS 33 corresponds to the first output terminal and the second output terminal of the receiving circuit 22. In the present specification, the CMOS level is a logic level corresponding to "0" data or "1" data. Hereinafter, the voltage of a logic level corresponding to "0" data may be referred to as an "L" level, and the voltage of a logic level corresponding to "1" data may be referred to as an "H" level.

The toggle detection circuit 34 is a circuit configured to detect whether or not the output signals OUT and /OUT respectively corresponding to the receive signals RCV and /RCV are toggled. The toggle detection circuit 34 generates a control signal DET based on the output signals OUT and /OUT. The control signal DET includes a result of detecting toggling by the toggle detection circuit 34. The toggle detection circuit 34 sets the control signal DET to, for example, an "L" level when the output signals OUT and /OUT are not toggled, and the control signal DET to an "H" level when the output signals OUT and /OUT are toggled. In the present specification, "toggling" means switching of a signal between a first state (for example, an "H" level) and a second state (for example, an "L" level).

<1-1-3> Configuration of CTLE 31

FIG. 3 is a circuit diagram showing an example of a configuration of the CTLE 31 included in the receiving circuit 22 according to the first embodiment. As shown in FIG. 3, the CTLE 31 includes, for example, constant current supplies CS1 and CS2, transistors T1 and T2, resistors R1 and R2, parasitic capacitance elements C1 and C2, a variable unit 311, a variable unit control circuit 312, and nodes ND1, ND2, ND3 and ND4.

Each of the constant current supplies CS1 and CS2 is a circuit configured to control an output current to be at a constant value. One end and the other end of the constant current supply CS1 are coupled to a power supply node VDD and a node ND1, respectively. One end and the other end of the constant current supply CS2 are coupled to the power supply node VDD and a node ND2, respectively. A power supply voltage is applied to the power supply node VDD.

Each of the transistors T1 and T2 is a P-type MOS transistor. The source end and the drain end of the transistor T1 are coupled to the nodes ND1 and ND3, respectively. The receive signal RCV is input to the gate end of the transistor T1. The source end and the drain end of the transistor T2 are coupled to the nodes ND2 and ND4, respectively. The receive signal /RCV is input to the gate end of the transistor T2.

Each of the resistors R1 and R2 is a resistor used as a load of the CTLE 31. One end and the other end of the resistor R1 are coupled to the node ND3 and a ground node VSS, respectively. One end and the other end of the resistor R2 are coupled to the node ND4 and the ground node VSS, respectively. The ground node VSS is grounded. An element being "grounded" means coupling the element to an interconnect to which a voltage which serves as a reference potential when, for example, the CTLE 31 operates is applied. The ground node VSS may be a node to which a ground voltage lower than a power supply voltage is applied. As the load of the CTLE 31, an inductor may be used.

The parasitic capacitance elements C1 and C2 are parasitic capacitances coupled to output nodes of the CTLE 31. One end and the other end of the parasitic capacitance element C1 are coupled to the node ND3 and the ground node VSS, respectively. One end and the other end of the parasitic capacitance element C2 are coupled to the node ND4 and the ground node VSS, respectively. In other words, the CTLE 31 outputs the equalized signals EQS and /EQS from the nodes ND3 and ND4, respectively.

The variable unit 311 includes, for example, a variable capacitance element VC and a variable resistor VR. A capacitance value of the variable capacitance element VC and a resistance value of the variable resistor VR are variable. One end and the other end of the variable capacitance element VC are coupled to the nodes ND1 and ND2 respectively. One end and the other end of the variable resistor VR are connected to the nodes ND1 and ND2 respectively.

The variable unit control circuit 312 switches the capacitance value of the variable capacitance element VC and the resistance value of the variable resistor VR included in the variable unit 311 based on the control signal BST[2:0] and the control signal DET. It is preferable that the variable unit control circuit 312 be configured to be capable of switching at least the variable value of the variable resistor VR. The variable unit 311 and the variable unit control circuit 312 included in the CTLE 31 are configured to be capable of adjusting a gain of the CTLE 31.

The circuit configuration of the CTLE 31 may be a different one. In the present embodiment, an example where the CTLE 31 has a configuration in which the P-type MOS transistor (each of the transistors T1 and T2) is adopted is disclosed, however, the embodiment is not limited to this example. The CTLE 31 may have a configuration in which an N-type MOS transistor is adopted. In a case where the CTLE 31 is configured adopting an N-type MOS transistor, in the circuit configuration of the CTLE 31 shown in FIG. 3, the CTLE 31 has a configuration in which, for example, the transistors T1 and T2 are replaced with the N-type MOS transistors and the power supply node VDD and the ground node VSS are interchanged.

(Circuit Configurations of Variable Resistor VR and Variable Unit Control Circuit 312)

FIG. 4 is a circuit diagram showing an example of a circuit configuration of the variable resistor VR and the variable unit control circuit 312 of the CTLE 31 according to the first embodiment. As shown in FIG. 4, the variable resistor VR includes switch units RS1, RS2, and RS3, for example. The variable unit control circuit 312 includes, for example, OR circuits O1, O2, and O3.

Each of the switch units RS1 to RS3 are coupled in parallel between the nodes ND1 and ND2. Each of the switch units RS1 through RS3 is configured to be capable of electrically coupling the nodes ND1 and ND2 with a corresponding resistor interposed therebetween, based on the control of the variable unit control circuit 312. Specifically, the switch unit RS1 includes transistors T3L and T3R and a resistor R3. The switch unit RS2 includes a transistor T4L and T4R and a resistor R4. The switch unit RS3 includes a transistor T5L and T5R and a resistor R5. One end of each of the transistors T3L, T4L, and T5L is coupled to the node ND1. The other end of each of the transistors T3L, T4L, and T5L is coupled to one end of each of the resistors R3, R4, and R5, respectively. The other end of each of the resistors R3, R4, and R5 is coupled to one end of each of the transistors T3R, T4R, and T5R, respectively. The other end of each of the transistors T3R, T4R, and T5R is coupled to the node ND2. In the present embodiment, the resistance values of the resistors R3, R4, and R5 are configured to be in the ratio of 1:2:4.

The OR circuits O1 to O3 are a logic circuit configured to control the switch units RS1 to RS3, respectively. The control signals BST0 and DET are input to a first input terminal and a second input terminal of the OR circuit O1, respectively. The output terminal of the OR circuit O1 is coupled to the gate end of each of the transistors T3L and T3R of the switch units RS1. The control signals BST1 and DET are input to a first input terminal and a second input terminal of the OR circuit O2, respectively. The output terminal of the OR circuit O2 is coupled to the gate end of each of the transistors T4L and T4R of the switch units RS2. The control signals BST2 and DET are input to a first input terminal and a second input terminal of the OR circuit O3, respectively. The output terminal of the OR circuit O3 is coupled to the gate end of each of the transistors T5L and T5R of the switch units RS3. In such a manner, if the control signal DET is at an "L" level, the variable unit control circuit 312 controls the transistors included in each of the plurality of switch units RS to be in an on state or an off state based on the control signal BST. If the control signal DET is at an "H" level, the variable unit control circuit 312 controls the transistors included in each of the plurality of switch units RS to be in an off state.

The circuit configuration of the variable resistor VR and the variable unit control circuit 312 is not limited to the above-described configuration. The circuit configuration of the variable resistor VR and the variable unit control circuit 312 may further include a set of the switch units RS and OR circuits in accordance with the number of bits of an EQ boost code. It suffices that the variable resistor VR and the variable unit control circuit 312 are capable of switching the resistance value of the variable resistor VR based on the control signals BST and DET as described later.

(Frequency Characteristics of CTLE 31)

FIG. 5 is a graph showing an example of frequency characteristics of the CTLE 31 according to the first embodiment. The vertical axis of the graph of FIG. 5 indicates a voltage gain [dB] in the CTLE 31. The horizontal axis of the graph of FIG. 5 indicates a frequency [Hz]. In the present specification, a low frequency band is a frequency band lower than a few hundreds of MHz. The high frequency band is a frequency band on the order of gigahertz, including a Nyquist frequency (Nyq.).

As shown in FIG. 5, the equalization characteristics of the CTLE 31 are set in such a manner that the gain of the high frequency band is higher than that of the low frequency band. For example, the CTLE 31 has equalization characteristics that allow the gain in the vicinity of a Nyquist frequency to be high. The amount of boost in the CTLE 31 is, for example, defined as a difference between the gain of the low frequency band and the gain of the high frequency band in the equalization characteristics of the CTLE 31. The higher the amount of the boost in the CTLE 31 becomes, the greater the difference between the gain of the low frequency band and that of the high frequency band becomes.

Specifically, the difference between the gain of the low frequency band and the gain of the high frequency band when EQcode=6 is greater than that between the gain of the low frequency band and the gain of the high frequency band when EQcode=0. When EQcode=7, each switch unit RS included in the variable resistor VR is in an off state, and the coupling between the nodes ND1 and ND2 in the CTLE 31 is in an open state. For this reason, the difference between the gain of the low frequency band and the gain of the high frequency band when EQcode=7 is significantly greater than the difference in the other EQcode settings. In other words, if EQcode=7, the CTLE 31 operates as a high-pass filter.

(Output Characteristics of CTLE 31)

FIG. 6 is a timing chart showing an example of output characteristics of the CTLE 31 according to the first embodiment. In FIG. 6, the vertical axis indicates a voltage value, and a horizontal axis indicates time. Each of FIGS. 6 (A), (B), (C), and (D) shows the voltage value change of each signal in the range between 0 [V] and V1 [V]. FIG. 6 (A) shows the voltage value change of the receive signals RCV and /RCV that are input to the pads PD3 and PD4 (pad ends) of the receiving device 2. Each of FIGS. 6 (B), (C), and (D) shows the voltage (CTLE output) value change of the equalized signals EQS and /EQS that are output from the CTLE 31 to which the receive signals RCV and /RCV shown in FIG. 6 (A) are input. FIGS. 6 (B), (C), and (D) correspond to cases where an EQ boost code applied to the CTLE 31 is set to EQcode=0, EQcode=6, and EQcode=7, respectively.

The time t1 shown in FIG. 6 corresponds to a timing at which the toggling of the receive signals RCV and /RCV starts at the pad ends, and a timing at which the equalized signals EQS and /EQS based on the receive signals RCV and /RCV for which toggling has started at the CTLE 31 are output. The time t2 shown in FIG. 6 corresponds to a timing at which the toggling of the receive signals RCV and /RCV stops at the pad ends, and a timing at which the equalized signals EQS and /EQS based on the receive signals RCV and /RCV for which toggling has stopped at the CTLE 31 are output. The period between the time t1 and the time t2 is divided into a period P1 corresponding to a certain period starting from the time t1 and a period P2 corresponding to a period between the end point of the period P1 and the time t2. The time beyond time t2 is shown as a period P3.

First, with reference to FIG. 6 (A), an example of the change of the receive signals RCV and /RCV that are input to the pad ends is explained. The receive signals RCV and /RCV before the toggling starts (before time t1) are fixed to voltages corresponding to "1" and "0", respectively. In other words, DC signals are input to the CTLE31. Then, at time t1, toggling of the receive signals RCV and /RCV starts. In the present embodiment, the voltage value (amplitude) in the valley part and that in the crest part differ between the receive signals RCV and /RCV during toggling. Such waveforms indicate that the duty cycle differs between the receive signals RCV and /RCV. Then, at time t2, toggling of receive signals RCV and /RCV stops. The receive signals RCV and /RCV after toggling stops change so as to be the same voltages as those before time t1.

Next, an example of the change in the equalized signals EQS and /EQS that are output from the CTLE 31 when EQcode=0 is explained with reference to FIG. 6(B). Before time t1, the equalized signals EQS and /EQS are fixed to the voltages corresponding to "1" and "0", respectively.

Between time t1 and time t2, the duty cycle of the equalized signals EQS and /EQS that are output from the CTLE 31 when EQcode=0 is improved compared to the duty cycle at the pad ends because of the amplification of the high frequency band by the CTLE 31. After time t2, the equalized signals EQS and /EQS change so as to be the same as the voltages before time t1.

Next, an example of the change in the equalized signals EQS and /EQS that are output from the CTLE 31 when EQcode=6 is explained with reference to FIG. 6(C). Before time t1, the equalized signals EQS and /EQS have a smaller voltage difference compared to the case of EQcode=0, and are fixed to the voltages corresponding to "1" and "0", respectively. Between time t1 and time t2, the duty cycle of the equalized signals EQS and /EQS that are output from the CTLE 31 when EQcode=6 is improved compared to the duty cycle in the case of EQcode=0 because of a larger gain difference in the high frequency band and the low frequency band compared to the gain difference in the case of EQcode=0. After time t2, the equalized signals EQS and /EQS change so as to be the same as the voltages before time t1.

Next, an example of the change in the equalized signals EQS and /EQS that are output from the CTLE 31 when EQcode=7 is explained with reference to FIG. 6 (D). EQcode=7 corresponds to an open state of the variable resistor VR between the nodes ND1 and ND2, namely a state where the resistance value of the variable resistor VR is ∞Q. For this reason, the voltage difference between the equalized signals EQS and /EQS before time t1 is extremely small compared to the difference in the other EQ boost code settings. Between time t1 and time t2, the duty cycle of the equalized signals EQS and /EQS that are output from the CTLE 31 when EQcode=7 is improved compared to the duty cycle in the case of EQcode=6 because of a larger difference between the gain in the high frequency band and the gain in the low frequency band compared to the gain difference in the case of EQcode=6. After time t2, the equalized signals EQS and /EQS change so as to be the same as the voltages before time t1.

Herein, waveforms of the receive signals RCV and /RCV in periods P1 to P3 are explained, with focus on the case where EQcode=6 and the case where EQcode=7.

If EQcode=6, the shape of the waveform W1 of the equalized signals EQS and /EQS corresponding to the period P1 is similar to the shape of the waveform W2 of the equalized signals EQS and /EQS corresponding to the period P2. If EQcode=6, the shape of the waveform W3 of the equalized signals EQS and /EQS corresponding to the period P3 shows that the voltage difference between the equalized signals EQS and /EQS is stationarily at a constant level. For this reason, an erroneous detection by the PGA 32 and the FS 33 that handle a differential signal corresponding to the waveform W3 can be suppressed.

If EQcode=7, the shape of the waveform W4 of the equalized signals EQS and /EQS corresponding to the period P1 is inconsistent compared to the shape of the waveform W5 of the equalized signals EQS and /EQS corresponding to the period P2. In other words, if EQcode=7, the CTLE 31 requires a certain period of time after toggling of the receive signals RCV and /RCV starts until toggling of the equalized signals EQS and /EQS (namely, a duty cycle) becomes stable. If EQcode=7, the waveform W6 of the equalized signals EQS and /EQS corresponding to the period P3 shows that the voltage difference between the equalized signals EQS and /EQS is smaller compared to the waveform W3 in the case of EQcode=6. For this reason, there is a possibility that an erroneous detection by the PGA 32 and the FS 33 that handles a differential signal corresponding to the waveform W6 may occur.

<1-1-4> Configuration of Toggle Detection Circuit 34

FIG. 7 is a circuit diagram showing an example of a circuit configuration of the toggle detection circuit 34 included in the receiving circuit 22 according to the first embodiment. As shown in FIG. 7, the toggle detection circuit 34 includes, for example, constant current supplies CS3 and CS4, transistors T6 and T7, constant current supplies CS5 and CS6, capacitance elements C3 and C4, OR circuits O4, an inverter INV, and nodes ND5 and ND6.

Each of the constant current supplies CS3 and CS4 is a circuit configured to control an output current to be at a constant value. One end of each of the constant current supplies CS3 and CS4 is coupled to the power supply node VDD. The output current of each of the constant current supplies CS3 and CS4 is adjusted to "current I1".

Each of the transistors T6 and T7 is a P-type MOS transistor. The source end and the drain end of the transistor T6 are coupled to the other end of the constant current supply CS3 and the node ND5, respectively. The output signal OUT is input to the gate end of the transistor T6. The source end and the drain end of the transistor T7 are coupled to the other end of the constant current supply CS4 and the node ND6, respectively. The output signal /OUT via the inverter INV is input to the gate end of the transistor T7. In other words, an inversion signal of the output signal /OUT is input to the gate end of the transistor T7.

Each of the constant current supplies CS5 and CS6 is a circuit configured to control an output current to be at a constant value. One end and the other end of the constant current supply CS5 are coupled to the node ND5 and the ground node VSS, respectively. One end and the other end of the constant current supply CS6 are coupled to the node ND6 and the ground node VSS, respectively. The output current of each of the constant current supplies CS5 and CS6 is adjusted to "current I2". In the toggle detection circuit 34, the output current of each of the constant current supplies CS3 to CS6 is set in such a manner that the relationship I1>I2 is satisfied.

The capacitance elements C3 and C4 are capacitances coupled to input terminals of the OR circuit O4. One end and the other end of the capacitance element C3 are coupled to the node ND5 and the ground node VSS, respectively. One end and the other end of the capacitance element C4 are coupled to the node ND6 and the ground node VSS, respectively. The capacitance value of the capacitance element C3 and that of the capacitance element C4 are set at substantially the same value. Hereinafter, the capacitance values of the capacitance elements C3 and C4 will be referred to as a "capacitance C".

The OR circuit O4 is a logic circuit configured to output a computation result of a logical sum of the voltage values of the nodes ND5 and ND6. In other words, a first input terminal and a second input terminal of the OR circuit O4 are coupled to the nodes ND5 and ND6, respectively. The signal that is output from the output terminal of the OR circuit O4 corresponds to a control signal DET that is output from the toggle detection circuit 34.

The circuit configuration of the toggle detection circuit 34 may be a different one. In the present embodiment, an example where the toggle detection circuit 34 has a configuration in which the P-type MOS transistor (each of the transistors T6 and T7) is adopted is disclosed, however, the embodiment is not limited to this example. The toggle detection circuit 34 may have a configuration in which an N-type MOS transistor is adopted. In a case where the toggle detection circuit 34 is configured with an N-type MOS transistor, the toggle detection circuit 34 in the circuit configuration shown in FIG. 7 has a configuration in which, for example, the transistors T6 and T7 are replaced with the N-type MOS transistors.

(Output Characteristics of Toggle Detection Circuit 34)

FIG. 8 is a timing chart showing an example of output characteristics of the toggle detection circuit 34 according to the first embodiment. In FIG. 8, the vertical axis indicates a voltage value, and a horizontal axis indicates time. FIG. 8 (A) shows the change in the voltage value (amplitude) of the receive signals RCV and /RCV that are input to the pad ends, similar to the case shown in FIG. 6 (A). FIG. 8 (B) shows the change in the voltage values VND of the nodes ND5 and ND6 included in the toggle detection circuit 34 in the range between 0 [V] and V2 [V]. FIG. 8 (C) shows the output signal of the OR circuit O4 included in the toggle detection circuit 34, namely the voltage change of the control signal DET in binary form ("L" level and "H" level). Times t1 and t2 shown in FIG. 8 are associated with a timing similar to times t1 and t2 shown in FIG. 6, respectively.

As shown in FIG. 8, the voltage VND before time t1 ranges in the vicinity of 0 V. In other words, before time t1, the voltage VND is a voltage at an "L" level. For this reason, the OR circuit O4 outputs a control signal DET at an "L" level based on the fact that the voltage VND at each of the first input terminal (node ND5) and the second input terminal (node ND6) is at an "L" level.

At time t1, toggling of the receive signals RCV and /RCV starts. Then, the transistor T6 of the toggle detection circuit 34 is turned to an on state at a timing at which the receive signal RCV is at an "L" level, and to an off state at which the receive signal RCV is at an "H" level. Similarly, the transistor T7 of the toggle detection circuit 34 is turned to an on state at a timing at which the receive signal /RCV is at an "H" level (i.e., the timing at which the voltage of the gate end of the transistor T7 is at an "L" level), and to an off state at which the receive signal /RCV is at an "L" level (i.e., the timing at which the voltage of the gate end of the transistor T7 is at an "H" level). When each of the transistors T6 and T7 is in the on state, the capacitance elements C3 and C4 respectively coupled to the nodes ND5 and ND6 are charged based on the difference between the current I1 and the current I2. When each of the transistors T6 and T7 are at the off state, the capacitance elements C3 and C4 are discharged based on the current I2.

If toggling of the receive signals RCV and /RCV continues, the voltage VND keeps rising to a predetermined voltage based on the capacitance C by the iteration of charging and discharging of the capacitance elements C3 and C4. The voltage VND changes from an "L" level to an "H" level when the voltage VND rises from the vicinity of 0 V and exceeds a threshold voltage Vth. A threshold voltage Vth is a voltage used as a reference for determining a CMOS level by the OR circuit O4. Then, the OR circuit O4 outputs a control signal DET at an "H" level based on the fact that the voltage VND has changed to an "H" level. In FIG. 8, the timing at which the control signal DET changes from an "L" level to an "H" level is indicated as time t1'.

At time t2, toggling of the receive signals RCV and /RCV stops. Then, the receive signals RCV and /RCV are at an "H" level and an "L" level, respectively. In other words, an "H"-level voltage is applied to the gate end of each of the transistors T6 and T7 of the toggle detection circuit 34, and the transistors T6 and T7 are turned to the off state. Thus, the capacitance elements C3 and C4 are discharged based on the current I2.

If toggling of the receive signals RCV and /RCV has been stopped, the voltage VND gradually decreases to close to 0 V. The voltage VND changes from an "H" level to an "L" level when it drops below the threshold voltage Vth from an "H" level. Then, the OR circuit O4 outputs a control signal DET at an "L" level based on the fact that the voltage VND has changed to an "L" level. In FIG. 8, the timing at which the control signal DET changes from an "H" level to an "L" level is indicated as time t2'.

The timing at which the toggle detection circuit 34 detects starting and stopping of toggling of the receive signals RCV and /RCV varies in accordance with the amplitude of the current I1 and I2 and the size of the capacitance C. In other words, the sensitivity of the toggle detection circuit 34 to detect a start and a stop of toggling of the receive signals RCV and /RCV may be adjusted based on the amplitude of the current I1 and I2 and the size of the capacitance C. For example, in a state in which the currents I1 and I2 are fixed, the larger the capacitance C is, the greater an amplitude involved in the charging and discharging of the voltage VND becomes, and the influence of noise is thereby suppressed. In a state in which the current I2 and the capacitance C are fixed, the larger the current I1 is, the more quickly the voltage VND is charged, and in turn, the sooner the start of toggling of the receive signals RCV and /RCV can be detected. In a state in which the current I1 and the capacitance C are fixed, the higher the current I2 is, the more quickly the voltage VND is discharged, and in turn, the sooner the stop of toggling of the receive signals RCV and /RCV can be detected.

At each input terminal of the OR circuit O4, a threshold voltage Vth for detecting the transition of the voltage VND from an "L" level to an "H" level may differ from a threshold voltage Vth for detecting the transition of the voltage VND from an "H" level to an "L" level. In other words, the toggle detection circuit 34 may include a hysteresis circuit. With a hysteresis circuit, the toggle detection circuit 34 can suppress the influence of noise in the vicinity of threshold voltage Vth.

<1-2> Operation

Hereinafter, an operation of the receiving circuit 22 relating to a method of receiving the receive signals RCV and /RCV by the receiving device 2 according to the first embodiment is explained.

<1-2-1> Operation of Variable Resistor VR and Variable Unit Control Circuit 312

First, a specific example of the operation of the variable unit 311 and the variable unit control circuit 312 is explained.

(Case where the Control Signal DET="0")

FIG. 9 is a schematic diagram showing a first example of an operation of the variable unit 311 and the variable unit control circuit 312 of the CTLE 31 according to the first embodiment. FIG. 9 shows an operation of the variable resistor VR and the variable unit control circuit 312 in a case where the control signal DET="0" and the control signal BST[2:0]="110".

As shown in FIG. 9, if the control signal DET="0", a voltage corresponding to "0" (namely, an "L" level) is input to the first input terminal of each of the OR circuits O1 to O3 of the variable unit control circuit 312. In this case, each of the OR circuits O1 to O3 switches an output voltage based on a voltage that is input to the second input terminal, that is, an EQ boost code.

In the present embodiment, the output of the OR circuit O1 is at an "L" level based on the control signal BST0="0". Then, at the switch unit RS1, the transistors T3L and T3R are turned to the on state based on the fact that the output of the OR circuit O1 is at an "L" level, and a current path via a resistor R3 between the nodes ND1 and ND2 is thereby formed.

The output of the OR circuit O2 is at an "H" level based on the control signal BST1="1". Then, at the switch unit RS2, the transistors T4L and T4R are turned to the off state based on the fact that the output of the OR circuit O2 is at an "H" level, and a current path via a resistor R4 between the nodes ND1 and ND2 is thereby cut off.

The output of the OR circuit O3 is at an "H" level based on the control signal BST2="1". Then, at the switch unit RS3, the transistors T5L and T5R are turned to the off state based on the fact that the output of the OR circuit O3 is at an "H" level, and a current path via a resistor R5 between the nodes ND1 and ND2 is thereby cut off.

(Case where the Control Signal DET="1")

FIG. 10 is a schematic diagram showing a second example of an operation of the variable unit 311 and the variable unit control circuit 312 of the CTLE 31 according to the first embodiment. FIG. 10 shows an operation of the variable resistor VR and the variable unit control circuit 312 in a case where the control signal DET="1" and the control signal BST[2:0]="110".

As shown in FIG. 10, if the control signal DET="1", a voltage corresponding to "1" (i.e., an "H" level) is input to the first input terminal of each of the OR circuits O1 to O3 of the variable unit control circuit 312. In this case, the output of each of the OR circuits O1 to O3 becomes an "H" level, regardless of a voltage that is input to the second input terminal, that is, an EQ boost code. In this case, a current path between the nodes ND1 and ND2 is cut off in each of the switch units RS1 to RS3. In other words, if the control signal DET="1", the CTLE 31 is in the same state as when EQcode=7, and operates as a high-pass filter.

<1-2-2> Simulation Results of Operation of Receiving Circuit 22

FIG. 11 is a timing chart showing a simulation result of an operation of the receiving circuit 22 according to the first embodiment. FIG. 11 (A) shows the voltage value change of the receive signals RCV and /RCV that are input to the pad ends, similar to the case shown in FIG. 6 (A). FIG. 11 (B) shows the change in the voltage (CTLE output) value of the equalized signals EQS and /EQS that are output from the CTLE 31 according to the first embodiment. FIG. 11 (C) shows the change in the voltage (FS output) value of the output signals OUT and /OUT that are output from the FS 33. FIG. 11 (D) shows the change in a duty cycle in a case where the duty cycle at the pad ends is set to 50% within ±20%. FIG. 11 (E) shows the change in a duty cycle of an output voltage of the CTLE 31 under multiple conditions shown in FIG. 11 (D). FIG. 11 (F) shows the change in the voltage value VND of the nodes ND5 and ND6 similar to FIG. 8 (B). FIG. 11 (G) shows the change in a voltage of the control signal DET similar to FIG. 8 (C). Times t1, t1', t2 and t2' shown in FIG. 11 are associated with timing similar to times t1, t1', t2 and t2' shown in FIG. 8, respectively. In the present embodiment, suppose EQcode=6 (i.e., BST[2:0]=110) is set as a control parameter of the receiving circuit 22.

The change in a voltage of the receive signals RCV and /RCV as shown in FIG. 11 (A) corresponds to one of the duty cycle settings shown in FIG. 11 (D). As shown in FIG. 11 (B), the equalized signals EQS and /EQS that are output from the CTLE 31 according to the first embodiment show a waveform in accordance with the change in the control signal DET.

Specifically, since the control signal DET is at an "L" level between time t1 and time t1', the equalized signals EQS and /EQS come into a shape based on the waveform corresponding to EQcode=6 (the waveform W1 in FIG. 6 (C)). Since the control signal DET is at an "H" level between time t1' and time t2, the equalized signals EQS and /EQS come into a shape based on the waveform corresponding to EQcode=7 (the waveform W5 in FIG. 6 (D)). Since the control signal DET is at an "H" level between time t2 and time t2', the equalized signals EQS and /EQS come into a shape based on the waveform corresponding to EQcode=7 (the waveform W6 in FIG. 6 (D)). Since the control signal DET is at an "L" level after time t2', the equalized signals EQS and /EQS come into a shape based on the waveform corresponding to EQcode=6 (the waveform W3 in FIG. 6 (C)). The length of the interval between time t1 and time t1' and that between time t2 and time t2' may change in accordance with the circuit configuration of the toggle detection circuit 34.

In the present embodiment, as shown in FIG. 11 (D), the duty cycle at the pad ends is set to 50% within ±20% between time t1' and time t2. In this case, in the CTLE 31 according to the first embodiment, the duty cycle of the CTLE output between time t1' and time t2 falls within the range of ±2%, as shown in FIG. 11 (E).

<1-3> Advantageous Effects of First Embodiment

According to the receiving device 2 of the foregoing first embodiment, it is possible to shorten the time required for correcting the duty cycle of a signal transmitted from a transmitting device and to reduce the cost of the receiving device at the same time. The details of advantageous effects of the first embodiment are described below.

A loss of a signal increases in a band as the communication speed is enhanced, and transmission of signals between a transmitting device and a receiving device becomes difficult, therefore, the quality of clock signals CLK becomes important. Usually, a receiving device has a duty correction circuit for the purpose of improving a quality of clock signals CLK, and gives a training period to train the correction circuit to correct a duty cycle of the clock signals CLK before the receiving device receives data from a transmitting device.

However, a large size of such a correction circuit can be a factor in causing an increase in a cost in manufacturing a receiving device. Furthermore, providing a training period can be a factor in causing an increase in latency in data transmission and reception. If the CTLE 31 is set to function as a high-pass filter from the beginning in the first embodiment, the output of the CTLE 31 is a signal having a small voltage difference. In this case, the differential amplitude is close to 0 V, and the output of a differential amplification circuit included in the receiving circuit 22 becomes unstable. In other words, the differential amplitude being close to 0 V can be a factor in causing an erroneous detection of a signal.

To address such a situation, the receiving circuit 22 of the receiving device 2 according to the first embodiment has the structure capable of actively switching the gain of the equalizer circuit (CTLE 31) based on the receive signals RCV and /RCV. Specifically, the receiving circuit 22 includes the toggle detection circuit 34 capable of detecting toggling of the receive signals RCV and /RCV.

The receiving circuit 22 dynamically switches the gain of the CTLE 31 based on the control signal DET corresponding to a result of detecting toggling by the toggle detection circuit 34. In other words, the gain of the CTLE 31 is dynamically switched by the toggle detection circuit 34. The gain of the CTLE 31 switched by the toggle detection circuit 34 is a gain of a low frequency band that does not include a Nyquist frequency.

FIG. 12 is a schematic diagram showing an overview of gain switching by the receiving circuit 22 according to the first embodiment. FIG. 12 (A) shows the change in the voltage of the equalized signals EQS and /EQS that are output from the CTLE 31 when EQcode=6, similar to the case shown in FIG. 6 (C). FIG. 12 (B) shows the change in the voltage of the equalized signals EQS and /EQS that are output from the CTLE 31 when EQcode=7, similar to the case shown in FIG. 6 (D). FIG. 12 (C) shows the change in the EQ boost code along with the change of the control signal DET shown in FIG. 8 (C). Times t1, t1', t2 and t2' shown in FIG. 12 are associated with timing similar to times t1, t1', t2 and t2' shown in FIG. 8, respectively.

As shown in FIG. 12, for example, if the control signal DET that is output from the toggle detection circuit 34 is at an "L" level, the receiving circuit 22 applies an arbitrarily selected EQ boost code (for example, EQcode=6). If, on the other hand, the control signal DET is at an "H" level, the receiving circuit 22 applies a specific EQ boost code (for example, EQcode=7) regardless of an EQ boost code setting. As the setting of an EQ boost code used by the receiving circuit 22, it is preferable to apply a setting in which, if a DC signal is input to the CTLE 31, a gain difference between the high frequency band and the low frequency band is relatively small (e.g., EQcode=6). It is preferable to apply a setting in which, if a toggling signal (AC signal) is input to the CTLE 31, a gain difference between the high frequency band and the low frequency band is relatively large (e.g., EQcode=7). In other words, the receiving circuit 22 is configured to reduce a DC gain of the CTLE 31 and correct a duty cycle if the toggle detection circuit 34 detects signal toggling. In other words, the receiving circuit 22 is designed in such a manner that the gain of the low frequency band of the CTLE 31 in the case where the toggle detection circuit 34 detects toggling of the receive signals RCV and /RCV is lower than the gain of the low frequency band of the CTLE 31 in the case where the toggle detection circuit 34 does not detect toggling of the receive signals RCV and /RCV.

It is thereby possible for the CTLE 31 to output a DC signal having a large voltage difference because of the setting of EQcode=6, even when toggling of the signals received from the transmitting device 1 (receive signals RCV and /RCV) does not take place. In other words, it is possible to suppress an unstable output from the differential amplifying circuit caused by the output a DC signal having a small voltage difference from the CTLE 31. Furthermore, in the receiving circuit 22, a time difference occurs between when toggling of the receive signals RCV and /RCV starts and when the toggle detection circuit 34 detects toggling. For this reason, the CTLE 31 can output a stable waveform, such as the waveform W1 in the case of EQcode=6, during a certain period of time after toggling starts, and can suppress an output of an unstable amplitude, such as the waveform W4 in the case of EQcode=7. Furthermore, the CTLE 31 can output a waveform in the case of EQcode=7, with which a more preferable duty cycle can be realized, when the control signal DET changes from an "L" level to an "H" level. Furthermore, the CTLE 31 can output a DC signal having a large voltage difference, such as the waveform W3 in the case of EQcode=6, when the control signal DET changes from an "H" level to an "L" level.

As explained above, the receiving circuit 22 according to the first embodiment switches the gain of the CTLE 31 based on whether or not toggling is detected by the toggle detection circuit 34. The toggle detection circuit 34 can be realized with a simple circuit configuration. For this reason, the circuit area of the receiving circuit 22 according to the first embodiment can be suppressed compared to the case where an extra correction circuit is provided. Furthermore, the receiving circuit 22 according to the first embodiment switches between two predetermined binary EQ boost codes without calculating a detailed amount of correction. For this reason, with the receiving circuit 22 according to the first embodiment, a time for duty correction training can be shortened compared to the case where a normal duty correction circuit is used. For this reason, in the receiving circuit 22 according to the first embodiment, a time for duty correction training of received signal can be shortened compared to the case with a normal duty correction circuit.

Furthermore, in the receiving circuit 22, a time difference occurs between when toggling of the receive signals RCV and /RCV stops and when the toggle detection circuit 34 changes an "H" level of the control signal DET to an "L" level. For this reason, after toggling of the receive signals RCV and /RCV is stopped, the CTLE 31 may output a DC signal having a small voltage difference, like the one exemplified by the waveform W6 in the case of EQcode=7. In contrast, the receiving circuit 22 according to the first embodiment can suppress occurrence of noise associated with an input of a DC signal having a small voltage difference through adjusting the setting of the constant current supplies CS3 to CS6 and the capacitance elements C3 and C4 in the toggle detection circuit 34.

<2> Second Embodiment

The second embodiment relates to a specific example in which the transmission system TS explained in the first embodiment is used as an interface circuit of a memory system MS provided with a NAND-type flash memory. A memory system MS according to the second embodiment is explained below.

<2-1> Configuration

<2-1-1> Configuration of Memory System MS

FIG. 13 is a block diagram showing a configuration example of the memory system MS according to the second embodiment. As shown in FIG. 13, the memory system MS is coupled to a host device HD. The host device HD is an external information processing device of the memory system MS. The host device HD is a personal computer or a server provided in a data center, for example. The host device HD may transmit various requests to the memory system MS.

The memory system MS is a memory device, for example, an SD™ card, a universal flash storage (UFS)

device, or a solid state drive (SSD). The memory system MS may perform a data write operation, a data read operation, and a data erase operation, etc. in accordance with instructions from the host device HD. The memory system MS includes a memory controller MC and memory devices MD1 to MD4, for example.

The memory controller MC is configured as an integrated circuit such as a system-on-a-chip (SoC), for example. The memory controller MC controls the memory devices MD based on a request received from the host device HD. Specifically, the memory controller MC instructs the memory device MD to perform data write based on a write request from the host device HD, for example. The memory controller MC instructs the memory device MD to perform data read based on a read request from the host device HD, and transmits, to the host device HD, data that is read from the memory device MD.

The memory controller MC includes, for example, a host interface circuit (host I/F) 40, a CPU 41, a RAM 42, a buffer memory 43, and a memory interface circuit (memory I/F) 44. The functions of the memory controller MC can be realized by a hardware structure, or a combination of hardware resources and firmware.

The host interface circuit 40 is a semiconductor integrated circuit configured to manage communications between the memory controller MC and the host device HD. The host interface circuit 40 is coupled to the host device HD via a host bus. The host bus includes a plurality of signal lines. The host bus is, for example, a bus compliant with an SD™ interface, SAS (serial attached SCSI (small computer system interface)), SATA (serial ATA (advanced technology attachment)), or PCIe™ (peripheral component interconnect express). When a request is received from the host device HD, part of the host interface circuit 40 may function as the receiving device 2 according to the first embodiment.

The CPU 41 controls the operation of the entire memory controller MC. For example, the CPU 41 issues a write order including a command, an address, etc., in response to a write request received from the host device HD. The issued write order is transferred to the memory device MD, and the memory device MD to which the write order is transferred executes a write operation based on the write order. The CPU 41 may execute a read operation in a manner similar to the write operation.

The RAM 42 is a volatile memory, for example. The RAM 42 is used as a working area of the CPU 41. The RAM 42 stores firmware for managing the plurality of memory devices MD, various types of management tables, etc. As the RAM 42, a semiconductor memory such as a static random access memory (SRAM) or a dynamic random access memory (DRAM) is used. The RAM 42 may be externally connected to the memory controller MC.

The buffer memory 43 is a volatile memory, for example. The buffer memory 43 is an SRAM (static random access memory), for example. The buffer memory 43 temporarily stores (buffers) data received by the memory controller MC from the memory device MD, data received by the memory controller MC from the host device HD, and the like. The buffer memory 43 may be externally coupled to the memory controller MC, or may be integrated with the RAM 42. The memory interface circuit 44 is a semiconductor integrated circuit configured to manage communications between the memory controller MC and the memory device MD. The memory interface circuit 44 is coupled to the memory devices MD1 to MD4 via a memory bus. The memory bus includes a plurality of signal lines. The memory bus is compliant with an SDR (single data rate) interface, a toggle DDR (double data rate) interface, or an ONFI (open NAND flash interface). The memory bus may include a plurality of channels. The plurality of memory devices MD may be coupled to each channel of the memory bus. When data is transmitted to the memory devices MD, part of the memory interface circuit 44 may function as the transmitting device 1 according to the first embodiment. When data is received from the memory device MD, part of the memory interface circuit 44 may function as the receiving device 2 according to the first embodiment.

The memory devices MD are a non-volatile memory, for example, a NAND flash memory. The memory devices MD include a plurality of memory cells and store data in a non-volatile manner. Each of the memory devices MD1 to MD4 is uniquely identifiable by configuring it to receive an individual chip enable signal or by being assigned with an individual chip address in advance. Thus, each of the memory devices MD1 to MD4 is separately operable in accordance with an instruction from the memory controller MC. It suffices that the number of memory devices MD included in the memory system MS is one or more.

<2-1-2> Configuration of Memory Device MD

FIG. 14 is a block diagram showing a configuration example of a memory device MD of the memory system MS according to a second embodiment. As shown in FIG. 14, each memory device MD includes, for example, a memory cell array 51, an input/output circuit 52, a logic controller 53, a register circuit 54, a sequencer 55, a driver circuit 56, a row decoder module 57, and a sense amplifier module 58.

The memory cell array 51 is a set of memory transistors capable of storing data in a non-volatile manner. The memory cell array 51 consists of a plurality of blocks BLK. The block BLK is used, for example, as a data erase unit. A plurality of bit lines BL and word lines WL are provided in the memory cell array 51. Each memory cell transistor is associated with a single bit line BL and a single word line WL.

The input/output circuit 52 is a semiconductor integrated circuit configured to be capable of transmitting and receiving a signal DQ<7:0> of an 8-bit width and the signals DQS and /DQS to and from the memory controller MC. The signal DQ may include data, status information, address information, and a command. The signal DQ may be called a "data signal". The signals DQS and /DQS are a signal that defines timing of transmitting and receiving the signal DQ. The signals DQS and /DQS are a signal pair having an opposite phase. The input/output circuit 52 may transmit and receive data DAT to and from the sense amplifier module 58.

Furthermore, the input/output circuit 52 includes the receiving circuit 22 according to the first embodiment to handle the signals DQS and /DQS. The signals DQS and /DQS correspond to the receive signals RCV and /RCV explained in the first embodiment, respectively. Each memory device MD includes a terminal portion 21 that includes a plurality of pads PD (input/output terminals) used for inputting and outputting signals DQ<7:0>, DQS, and /DQS. In other words, the plurality of pads PD included in the memory device MD are coupled to the memory interface circuit 44 of the memory controller MC. The input/output circuit 52 may be called a memory interface circuit of the memory device MD. The signal DQ<7:0> may be referred to as a "data signal". The signals DQS and /DQS may be called a "data strobe signal and its inversion signal". The signals DQS and /DQS may be called a "clock signal", "operation clock signal", "probe signal", or "timing control signal", etc.

The logic controller 53 controls the input/output circuit 52 and the sequencer 55 based on control signals received from the memory controller MC. As control signals handled by the logic controller 53, signals /CE, CLE, ALE, /WE, /RE, /WP, and /RB may be used, for example. The signal /CE enables the memory devices MD. The signal CLE is a signal for notifying the input/output circuit 52 that the received signal DQ is a command CMD. The signal ALE is a signal for notifying the input/output circuit 52 that the received signal DQ is address information. The signal /WE is a signal for instructing the input/output circuit 52 to input a signal DQ. The /RE is a signal for instructing the input/output circuit 52 to output the signal DQ. The signal /WPn is a signal for turning the memory devices MD to a protection state when the power of the memory system MS is turned on or off. The signal RBn is a signal for notifying the memory controller MC that the memory device MD is either in a ready state (a state of accepting external instructions) or in a busy state (a state of not accepting external instructions).

The register circuit 54 stores status information, address information, and a command. The status information is output to the memory controller MC based on an instruction from the memory controller MC. The address information may include, for example, a block address, a page address, and a column address, etc. The command includes an instruction relating to various operations of the memory devices MD.

The sequencer 55 controls an operation of the entire memory devices MD. For example, the sequencer 55 may execute a read operation, a write operation, an erase operation, and the like based on a command and address information stored in the register circuit 54. The sequencer 55 may update status information stored in the register circuit 54 based on an operation and a state of the memory device MD.

The driver circuit 56 generates voltages used in the read operation, the write operation, the erase operation, etc. The driver circuit 56 supplies the generated voltages to the memory cell array 51, the row decoder module 57, and the sense amplifier module 58.

The row decoder module 57 selects an operation-targeted block BLK based on the block address. The row decoder module 57 transfers the voltage supplied from the driver circuit 56 to, for example, word lines WL in the selected block BLK.

In the read operation, the sense amplifier module 58 reads the data DAT from the memory cell array 51, and transfers the read data DAT to the input/output circuit 52. In the write operation, the sense amplifier module 58 applies a desired voltage to a bit line BL based on the data DAT received from the input/output circuit 52.

<2-1-3> Configuration of Interface Part of Memory System MS

FIG. 15 is a block diagram showing a configuration example of an interface part between the memory controller MC and the memory device MD of the memory system MS according to the second embodiment. FIG. 15 shows a case where the memory controller MC operates as the transmitting device 1 and the memory devices MD operates as the receiving device 2. As shown in FIG. 15, the memory controller MC includes a PLL circuit 11, a clock distribution circuit 12, multiplexers 13 and 61, transmitting circuits 14 and 62, and a terminal portion 15. Each memory device MD includes a terminal portion 21, the receiving circuit 22, a control circuit 24, a clock distribution circuit 71, a sampler 72, and a processing circuit 73. The memory controller] MC and the memory devices MD are coupled by a plurality of pads PD included in the terminal portion 15, the transmission path TL, and a plurality of pads PD included in the terminal portion 21.

In the memory controller MC, the PLL circuit 11, the clock distribution circuit 12, the multiplexers 13 and 61, and the transmitting circuits 14 and 62 correspond to the memory interface circuit 44. The clock distribution circuit 12 of the second embodiment transfers one of the multiple types of clock signals that are input from the PLL circuit 11 to the multiplexer 61. The multiplexer 13 and the transmitting circuit 14 of the second embodiment operate in a manner similar to those of the first embodiment. In the second embodiment, the output of the transmitting circuit 14 corresponds to the signals DQS and /DQS.

Data transmitted from the memory controller MC to the memory devices MD (transmit data) is input to the multiplexer 61. The multiplexer 61 transfers, to the transmitting circuit 62, a digital signal corresponding to the transmit data based on a clock signal that is input from the clock distribution circuit 12. The transmitting circuit 62 is a circuit configured to transmit a signal corresponding to the digital signal that is input from the multiplexer 61. Then, the transmitting circuit 62 transmits a signal to the memory device MD via the terminal portion and the transmission line TL. The signals that are output from the transmitting circuit 62 correspond to the transmit signal DQ[7:0]. Although the illustration is omitted, the memory controller MC includes the multiplexer 61, the transmitting circuit 62, and the pads PD in accordance with the number of signal lines for signals DQ.

In the memory device MD, the receiving circuit 22, the control circuit 24, the clock distribution circuit 71, and the sampler 72 correspond to the input/output circuit 52. The processing circuit 73 corresponds to, for example, the register circuit 54 and the sense amplifier module 58. To the receiving circuit 22 of the second embodiment, the signals DQS and /DQS are input via the terminal portion 21. The output signals OUT and /OUT of the receiving circuit 22 of the second embodiment are input to the clock distribution circuit 71.

The clock distribution circuit 71 generates a clock signal CK based on the output signals OUT and /OUT that are output from the receiving circuit 22, namely reconstructed signals DQS and /DQS. The clock distribution circuit 71 then distributes the generated clock signals CK to a plurality of elements included in the transmitting device 1. In the present embodiment, the clock distribution circuit 71 transfers the generated clock signal CK to the sampler 72. The signal DQ[7:0] is input to the sampler 72 via the terminal portion 21. The sampler 72 samples data of the signal DQ[7:0] based on a timing indicated by the clock signal CK. Then, the sampler 72 transfers a sampling result of the signal DQ[7:0] to the processing circuit 73. FIG. 15 shows a single sampler 72, however, the embodiment is not limited thereto. The input/output circuit 52 may include one or more samplers 72 in accordance with the number of signal lines for the signal DQ.

Although not shown, the memory interface circuit 44 includes a semiconductor integrated circuit capable of encoding and transmitting information (data). Then, the memory interface circuit 44 inputs the encoded information to the transmission path TL as the signal DQ[7:0]. The signal DQ includes, for example, a plurality of pulse signals. Each pulse included in the signal DQ corresponds to modulated data. As a data modulation method, a pulse-amplitude modulation method may be used, for example. The pulse-amplitude modulation method is a modulation method for transmitting data by a voltage (amplitude) of a pulse. If the pulse-amplitude modulation is used as the data modulation method, a voltage level of the signal DQ for each pulse corresponds to 1-bit data or multiple-bit data. The memory controller MC may operate as the receiving device 2 and the memory devices MD may operate as the transmitting device 1. In this case, for example, the memory controller MC includes the structures included in the input/output circuit 52 shown in FIG. 15, and the memory devices MD include the structures included in the memory interface circuit 44.

In the memory system MS as explained above, a transmitter-side device transmits the signals DQS and /DQS to a receiver-side device when the signal DQ is communicated. Then, the receiver-side device samples the signal DQ at a timing based on the clock signal CK generated from the received signals DQS and /DQS. For example, if the receiver-side device is the memory device MD, the data sampled by the sampler 72 is stored into the memory cell array 51. In the memory system MS, when the signal DQ is not communicated, the transmission of the signals DQS and /DQS is stopped. In other words, the memory system MS uses an intermittent clock for data transmission and reception. The memory system MS according to the second embodiment can thus dynamically switch the gain of the CTLE 31 included in the receiving circuit 22, similar to the first embodiment.

<2-2> Effects of Second Embodiment

Similar to the first embodiment, the receiving circuit 22 used in the memory system MS according to the second embodiment can shorten a time required for correcting a duty cycle of a signal transmitted from a transmitting device (e.g., the memory controller MC) and to suppress the cost of a receiving device (e.g., the memory device MD).

The switching of the gain of the CTLE 31 included in the receiving circuit 22 allows the memory devices MD according to the second embodiment to correct the duty cycle of the clock signal CK used by the sampler 72. It is thereby possible for the memory devices MD according to the second embodiment to secure a timing margin for sampling the signal DQ[7:0] by the sampler 72. Furthermore, the memory system MS according to the second embodiment can shorten the period during which, in the case where an intermittent clock is used, the differential amplitude of the signals DQS and /DQS becomes zero when the clock signal is not transmitted, similar to the first embodiment.

As a result, the memory system MS according to the second embodiment can improve sampling accuracy in a communication between the memory controller MC and the memory devices MD and can suppress degradation of signal quality. The memory system MS according to the second embodiment can suppress a power consumption through use of the intermittent clock.

<3> Others

The configurations of the receiving device 2 described in the foregoing embodiments are merely examples. In the second embodiment, the case where the signal DQ is a single-phase signal (pulse signal) is explained, however, the signal DQ may be a differential signal. In the above embodiment, the case where the voltage level for each pulse corresponds to 1-bit data is explained, however, the embodiment is not limited thereto. Even if the multiple-bit data is assigned to a single pulse, the receiving device 2 dynamically switches the gain of the CTLE 31, and the same advantageous effects as those in the first embodiment can be achieved. In the second embodiment, the example in which the receiving circuit 22 is implemented in the memory device MD is explained, however, the embodiment is not limited to this example. The receiving circuit 22 may be implemented in either the host interface circuit 40 or the memory interface circuit 44. Each of the processes described in connection with each embodiment may be implemented by dedicated hardware. For example, the control circuit 24 may be an ASIC (Application Specific Integrated Circuit), or a programmable logic device (for example, an SPLD (Simple Programmable Logic Device), CPLD (Complex Programmable Logic Device), FPGA (Field Programmable Gate Array), etc.).

In the present specification, an "H"-level voltage corresponds to a voltage higher than a threshold when data is determined as binary. An "L"-level voltage corresponds to a voltage lower than a threshold when data is determined as binary. In the present specification, the term "couple" refers to electrical connection, and does not exclude intervention of another element therebetween. The device that processes data received by the receiving device 2 may be referred to as a "data processing device". In the present specification, one end and the other end of a transistor corresponds to a source or a drain of a transistor. In the present specification, a duty cycle indicates a ratio of "H"-level signals in signals within one cycle. In the present specification, a "first conductive type" corresponds to one of a "P-type" or "N-type", and a "second conductive type" corresponds to the other. In the present specification, a "logic level" corresponds to either one of an "H" level or an "L" level.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor integrated circuit comprising:
an equalizer circuit configured to amplify an input signal that is externally input to output an amplified signal as a first signal, the input signal having a period of time in which toggling stops; and
a toggle detection circuit configured to detect whether or not the first signal is toggling and to dynamically switch a gain of the equalizer circuit based on whether or not toggling of the first signal is detected, wherein
a first gain of a low frequency band of the equalizer circuit while the toggle detection circuit detects the toggling of the first signal is lower than a second gain of the low frequency band of the equalizer circuit while the toggle detection circuit does not detect the toggling of the first signal.

2. The semiconductor integrated circuit of claim 1, wherein
the toggle detection circuit is configured to switch a gain of the low frequency band of the equalizer circuit.

3. The semiconductor integrated circuit of claim 2, wherein the low frequency band does not include a Nyquist frequency.

4. The semiconductor integrated circuit of claim 1, wherein the first signal is a differential signal that include a second signal and a third signal that is an inversion signal of the second signal, and the equalizer circuit includes a continuous time linear equalizer (CTLE).

5. The semiconductor integrated circuit of claim 4, wherein the equalizer circuit includes a first current supply, a second current supply, a first transistor, a second transistor, a first resistor, a second resistor, and a variable resistor, one end of each of the first current supply and the second current supply is coupled to a first power supply node, the other end of the first current supply is coupled to one end of the first transistor, the other end of the second current supply is coupled to one end of the second transistor, the other end of the first transistor is coupled to one end of the first resistor, the other end of the second transistor is coupled to one end of the second resistor, and the other end of each of the first resistor and the second resistor is coupled to a second power supply node differing from the first power supply node, one end of the variable resistor is coupled to a first node that couples the first current supply to the first transistor, and the other end of the variable resistor is coupled to a second node that couples the second current supply to the second transistor, and a third node that couples the first transistor to the first resistor and a fourth node that couples the second transistor to the second resistor correspond to an output of the equalizer circuit.

6. The semiconductor integrated circuit of claim 5, wherein each of the first transistor and the second transistor is a P-type transistor, and a voltage to be applied to the first power supply node is higher than a voltage to be applied to the second power supply node.

7. The semiconductor integrated circuit of claim 5, wherein each of the first transistor and the second transistor is an N-type transistor, and a voltage to be applied to the first power supply node is lower than a voltage to be applied to the second power supply node.

8. The semiconductor integrated circuit of claim 5, further comprising:

a first control circuit configured to receive a first control signal and a second control signal and switch a resistance value of the variable resistor based on the first control signal and the second control signal, the first control signal including a control parameter for controlling the gain of the equalizer circuit, and the second control signal including a result of detecting the toggling by the toggle detection circuit.

9. The semiconductor integrated circuit of claim 8, wherein the toggle detection circuit is configured to:

set the second control signal to a first logic level if the toggling of the first signal does not take place; and set the second control signal to a second logic level which differs from the first logic level if the toggling of the first signal takes place, and the first control circuit is configured to:

if the second control signal is at the first logic level, cause the equalizer circuit to amplify the input signal at a gain based on the first control signal; and if the second control signal is at the second logic level, cause the equalizer circuit to amplify the input signal at a gain based on the second control signal.

10. The semiconductor integrated circuit of claim 8, wherein the variable resistor includes a plurality of switch units, each of the plurality of switch units including a third resistor and a third transistor coupled in series between the first node and the second node, and the first control circuit is configured to:

control the third transistor included in each of the plurality of switch units to be in an on state or an off state based on the first control signal if the second control signal is at the first logic level; and control the third transistor included in each of the plurality of switch units to be in the off state if the second control signal is at the second logic level.

11. The semiconductor integrated circuit of claim 8, wherein the toggle detection circuit includes a third current supply, a fourth current supply, a fifth current supply, a sixth current supply, a fourth transistor, a fifth transistor, a first capacitance element, a second capacitance element, an OR circuit, and an inverter, one end of each of the third current supply and the fourth current supply is coupled to a third power supply node, the other end of the third current supply is coupled to one end of the fourth transistor, the other end of the fourth current supply is coupled to one end of the fifth transistor, the other end of the fourth transistor is coupled to one end of the fifth current supply, the other end of the fifth transistor is coupled to one end of the sixth current supply, the second signal is configured to be input to a gate end of the fourth transistor, the third signal is configured to be input to a gate end of the fifth transistor via the inverter, and each of the other ends of the fifth current supply and the sixth current supply is coupled to a fourth power supply node to which a voltage lower than a voltage applied to the third current supply node is configured to be applied, one end of the first capacitance element is coupled to a fifth node that couples the fourth transistor to the fifth current supply, and the other end of the first capacitance element is coupled to the fourth power supply node, one end of the second capacitance element is coupled to a sixth node that couples the fifth transistor to the sixth current supply, and the other end of the second capacitance element is coupled to the fourth power supply node, and a first input terminal and a second input terminal of the OR circuit are coupled to the fifth node and the sixth node respectively, an output from the OR circuit corresponding to the second control signal.

12. The semiconductor integrated circuit of claim 1, further comprising:

a programmable gain amplifier (PGA) configured to amplify an output signal from the equalizer circuit.

13. The semiconductor integrated circuit of claim 12, further comprising:

a full scale (FS) amplifier configured to amplify an output signal from the PGA to a CMOS level.

14. A receiving device, comprising:
the semiconductor integrated circuit device according to claim 1;
a first pad coupled to a first input terminal of the equalizer circuit; and
a second pad coupled to a second input terminal of the equalizer circuit, wherein
the first signal is a differential signal that includes a second signal and a third signal that is an inversion signal of the second signal, the second signal is configured to be input to the first pad, and the third signal is configured to be input to the second pad.

15. The receiving device of claim 14, further comprising:
a second control circuit configured to supply to the equalizer circuit a first control signal that includes a control parameter for controlling the gain of the equalizer circuit.

16. The receiving device of claim 14, further comprising:
a processing circuit configured to receive a fourth signal based on the first signal from the equalizer circuit, wherein
the fourth signal includes a clock signal, and
the processing circuit is configured to operate based on the clock signal.

17. A memory system comprising:
the receiving device according to claim 15; and a transmitting device configured to transmit the input signal, wherein
one of the transmitting device and the receiving device is a memory device having memory cells capable of storing data in a non-volatile manner,
the other of the transmitting device and the receiving device is a memory controller configured to control the memory device, and
the receiving device is configured to receive a data signal from the transmitting device based on the input signal transmitted from the transmitting device.

18. The memory system of claim 17, wherein
the receiving device further comprises:
a sampler configured to sample the data signal received from the transmit signal; and
a distribution circuit configured to receive a fourth signal based on the first signal from the equalizer circuit; wherein
a fourth signal includes a clock signal,
the distribution circuit is configured to supply the clock signal to the sampler, and
the sampler is configured to sample the data signal at a timing based on the clock signal.

19. The memory system of claim 18, wherein
the memory device comprises a memory cell array that includes the plurality of the memory cells, and causes the memory cell array to store the data sampled by the sampler.

* * * * *